(12) United States Patent
Shen et al.

(10) Patent No.: US 11,509,400 B2
(45) Date of Patent: Nov. 22, 2022

(54) IMAGE TRANSMISSION SYSTEM AND IMAGE TRANSMISSION METHOD

(71) Applicant: AuthenX Inc., Hsinchu County (TW)

(72) Inventors: Po-Kuan Shen, Hsinchu County (TW); Chao-Chieh Hsu, Hsinchu County (TW); Chun-Chiang Yen, Hsinchu County (TW); Chiu-Lin Yu, Hsinchu County (TW); Kai-Lun Han, Hsinchu County (TW); Sheng-Fu Lin, Hsinchu County (TW); Jenq-Yang Chang, Hsinchu County (TW); Mao-Jen Wu, Hsinchu County (TW)

(73) Assignee: AuthenX Inc., Hsinchu County (TW)

( * ) Notice: Subject to any disclaimer, the term of this patent is extended or adjusted under 35 U.S.C. 154(b) by 7 days.

(21) Appl. No.: 17/096,973

(22) Filed: Nov. 13, 2020

(65) Prior Publication Data

US 2021/0152256 A1    May 20, 2021

Related U.S. Application Data

(60) Provisional application No. 62/959,144, filed on Jan. 9, 2020, provisional application No. 62/935,661, filed on Nov. 15, 2019.

(51) Int. Cl.
*H04B 10/80* (2013.01)
*G02B 6/12* (2006.01)
(Continued)

(52) U.S. Cl.
CPC ....... *H04B 10/801* (2013.01); *G02B 6/12004* (2013.01); *H05K 1/0274* (2013.01);
(Continued)

(58) Field of Classification Search
CPC .. G02B 6/12004; H04B 10/80; H04B 10/801; H04N 5/2257; H05K 1/0274;
(Continued)

(56) References Cited

U.S. PATENT DOCUMENTS 7,627,204 B1    12/2009   Deane
7,684,663 B2     3/2010   Deane
(Continued)

FOREIGN PATENT DOCUMENTS

JP    2012226377 A  * 11/2012  ........... G02B 6/4201

OTHER PUBLICATIONS

Hwang et al; Chip and board level optical interconnections using rigid flexible optical electrical printed circuit boards; May 2008; Optics Express; pp. 1-7. (Year: 2008).*
(Continued)

*Primary Examiner* — Amritbir K Sandhu
(74) *Attorney, Agent, or Firm* — CKC & Partners Co., LLC

(57) ABSTRACT

An image transmission system is disclosed. The image transmission system includes at least one image capturing device, at least one conversion device, at least one image processor, and at least one flexible printed circuit (FPC). The at least one FPC includes at least one conductive layer and at least one optical waveguide layer. The at least one image capturing device is configured to capture at least one data. The at least one conversion device is configured to perform a conversion between the at least one data and an optical signal. The at least one image processor is configured to obtain the at least one data according to the optical signal, and processes the data. The at least one optical waveguide layer is configured to transmit the optical signal.

25 Claims, 24 Drawing Sheets

(51) Int. Cl.
  *H05K 1/14* (2006.01)
  *H05K 1/18* (2006.01)
  *H05K 1/02* (2006.01)

(52) U.S. Cl.
  CPC ............ *H05K 1/147* (2013.01); *H05K 1/189* (2013.01); *H05K 2201/10121* (2013.01)

(58) Field of Classification Search
  CPC .. H05K 1/147; H05K 1/189; H05K 2201/052; H05K 2201/10121; H05K 2201/10151; H05K 2201/2009
  USPC ........................................................ 398/164
  See application file for complete search history.

(56) References Cited

U.S. PATENT DOCUMENTS

| | | | |
|---|---|---|---|
| 8,427,819 B1 * | 4/2013 | Li | H05K 1/142 |
| | | | 345/212 |
| 8,428,402 B2 * | 4/2013 | Hamana | G02B 6/4214 |
| | | | 385/14 |
| 8,588,558 B2 | 11/2013 | Vernooy et al. | |
| 9,176,277 B2 | 11/2015 | Suh et al. | |
| 9,219,598 B2 | 12/2015 | Blon et al. | |
| 9,235,011 B2 * | 1/2016 | Takano | G02B 6/4283 |
| 9,584,227 B2 | 2/2017 | Wiley | |
| 2005/0220393 A1 * | 10/2005 | Riester | G02B 6/4281 |
| | | | 385/14 |
| 2007/0272827 A1 * | 11/2007 | Heo | H01L 27/14618 |
| | | | 250/239 |
| 2008/0152286 A1 * | 6/2008 | Ueno | G02B 6/43 |
| | | | 385/101 |
| 2011/0052205 A1 * | 3/2011 | Yu | H04B 10/801 |
| | | | 398/142 |
| 2011/0148817 A1 * | 6/2011 | Nagafuji | G02B 6/1228 |
| | | | 345/175 |
| 2014/0193160 A1 * | 7/2014 | Yagisawa | G02B 6/4246 |
| | | | 398/136 |
| 2018/0367767 A1 | 12/2018 | MacKinnon | |
| 2019/0207681 A1 | 7/2019 | Sundaram | |
| 2021/0334505 A1 * | 10/2021 | Lin | G06V 10/147 |
| 2022/0206216 A1 * | 6/2022 | Shen | H01Q 9/045 |

OTHER PUBLICATIONS

Hwang et al; Chip and board level optical interconnections using rigid flexible optical electrical printed circuit boards ; May 2008; IEEE pp. 1-7. (Year: 2008).*

Hwang et al; Chip- and board-level optical interconnections using rigid flexible optical electrical printed circuit boards; May 2008; Optical society of America; pp. 1-7. (Year: 2008).*

\* cited by examiner

IMAGE TRANSMISSION SYSTEM AND IMAGE TRANSMISSION METHOD

CROSS-REFERENCE TO RELATED APPLICATION

This application claims priority to U.S. Provisional Application Ser. No. 62/935,661, filed Nov. 15, 2019 and U.S. Provisional Application Ser. No. 62/959,144, filed Jan. 9, 2020, all of which are herein incorporated by reference in their entireties.

BACKGROUND

Field of Invention

The present disclosure relates to a transmission system and a transmission method. More particularly, the present disclosure relates to an image transmission system for transmitting data through a flexible printed circuit (FPC), and an image data transmission method.

Description of Related Art

With advent of a digital and high-definition era, portable devices are now equipped with megapixel cameras and high-resolution displays. Portable devices often need to transmit data in a high speed, display high-definition videos, process 3D (3 dimensions) graphs, or access on-line games. RF (Radio frequency) function is widely used in portable devices. The RF function can be, for example, Wi-Fi, blue tooth, WLAN (Wireless Local Area Networks) . . . etc. Therefore, demand for data transmission and data computing of portable devices grows with each passing day.

To meet demand for high-speed data transmission and high-performance computing, architectures of portable devices become more complex, and ports of portable devices are increasing, such that demand for pins of ports enhances accordingly. Therefore, it is hard to design portable devices, and manufacturing cost of portable devices increases correspondingly. Hence, how to enhance integration of portable devices and limit number of pins when size of portable devices miniaturizes gradually becomes more and more important.

SUMMARY

The foregoing presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

The present disclosure provides an image transmission system. The image transmission system includes at least one image capturing device, at least one conversion device, at least one image processor, and at least one flexible printed circuit (FPC). The at least one FPC includes at least one conductive layer and at least one optical waveguide layer. The at least one image capturing device is configured to capture at least one data. The at least one conversion device is configured to perform a conversion between the at least one data and an optical signal. The at least one image processor is configured to obtain the at least one data according to the optical signal, and processes the data. The at least one optical waveguide layer is configured to transmit the optical signal.

The present disclosure provides an image transmission system. The image transmission system includes a plurality of image capturing devices, at least one serializing/deserializing circuit, at least one conversion device, at least one image processor, and at least one flexible printed circuit. The image capturing devices is configured to capture a plurality of data. The at least one serializing/deserializing circuit is configured to perform a conversion between the data and a serial data. The at least one conversion device is configured to perform a conversion between the serial data and an optical signal. The at least one image processor is configured to obtain the data according to the optical signal, and process the data. The at least one flexible printed circuit includes at least one conductive layer and at least one optical waveguide layer. The at least one optical waveguide layer is configured to transmit the optical signal.

An image transmission method is provided. The image transmission method includes steps of: a data is converted into a serial data through a serializing/deserializing circuit; subsequently, the serial data is converted into an optical signal; and transmitting the optical signal through an optical waveguide layer of a flexible printed circuit.

Therefore, based on the technical content of the present disclosure, the image transmission system and the image transmission method of the present disclosure adopt a flexible printed circuit to transmit signals with high speed. In addition, the image transmission system of the present disclosure adopts serializing/deserializing circuit. Therefore, the numbers of pins of the image transmission system of the present disclosure can be reduced efficiently, so as to decrease numbers of transmission lines and interference, such that an excellent solution for image transmission with high speed is provided.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
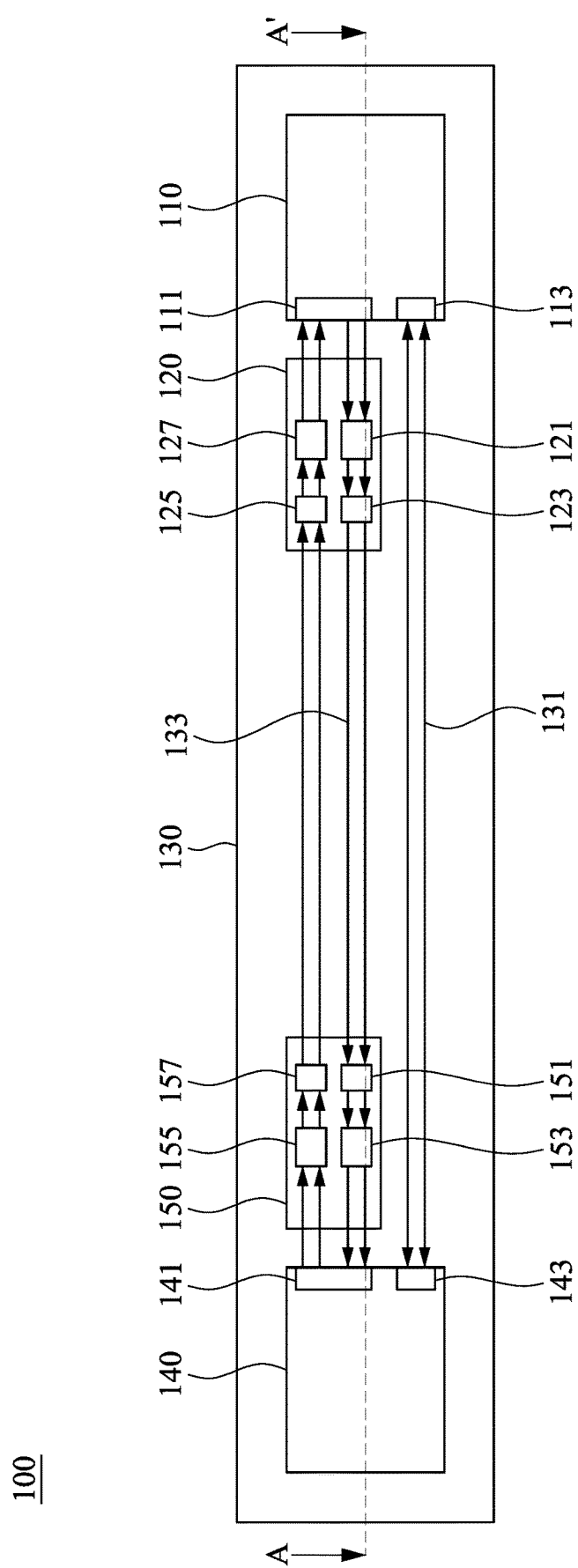
FIG. 1 depicts a schematic diagram of an image transmission system according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts. However, the embodiments provided herein are intended as illustrative only since numerous modifications and variations therein will be apparent to those skilled in the art. Description of the operation does not intend to limit the operation sequence. Any structures resulting from recombination of elements with equivalent effects are within the scope of the present invention.

FIG. 1 depicts a schematic diagram of an image transmission system 100 according to one embodiment of the present disclosure. As shown in the figure, the image transmission system 100 includes an image capturing device 110, a conversion device 120, a flexible printed circuit 130, an image processor 140, and a conversion device 150.

Figure 2:
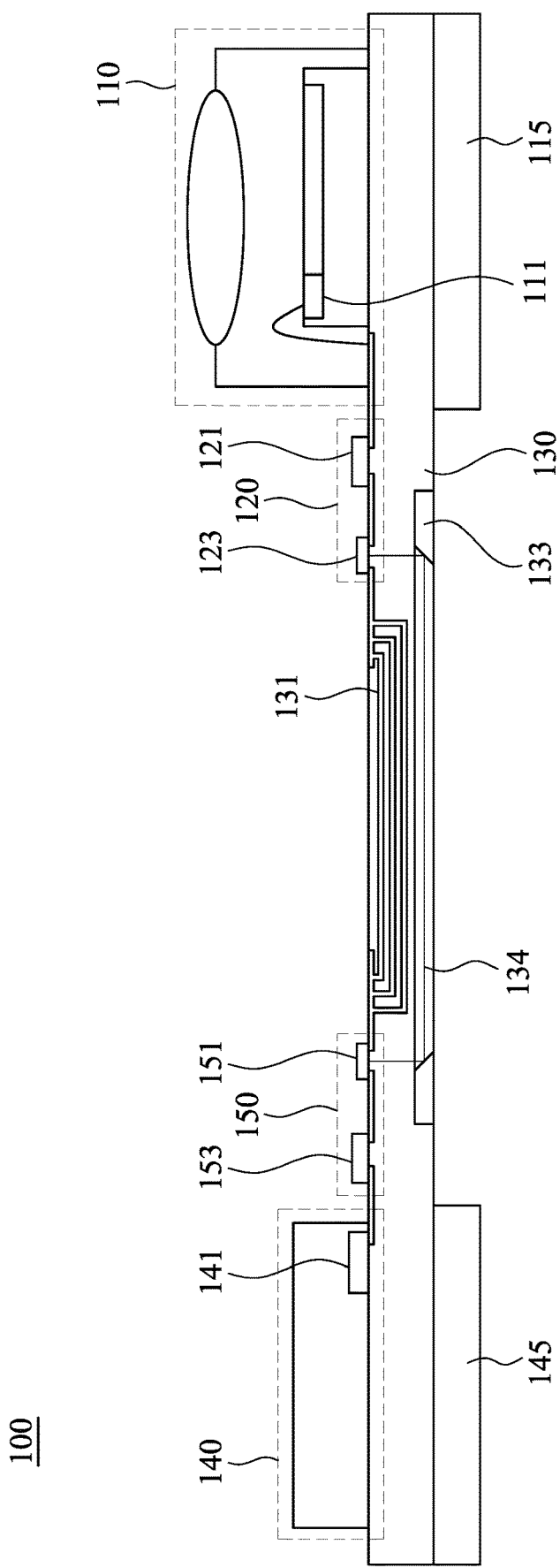
FIG. 2 depicts a schematic diagram of a cross-sectional view of the image transmission system shown in FIG. 1 according to one embodiment of the present disclosure.

For facilitating the understanding of the structure of the image transmission system 100 shown in FIG. 1, reference is now made to FIG. 2. FIG. 2 depicts a schematic diagram of a cross-sectional view along line AA' of the image transmission system 100 shown in FIG. 1 according to one embodiment of the present disclosure. As shown in the figure, the flexible printed circuit 130 includes a conductive layer 131 and an optical waveguide layer 133.

For facilitating the understanding of the operation of the image transmission system 100, reference is made to both FIG. 1 and FIG. 2. The image capturing device 110 captures data, transmits it to the conversion device 120, and the conversion device 120 converts the data into an optical signal 134. Subsequently, the conversion device 120 transmits the optical signal 134 to the optical waveguide layer 133, and the optical waveguide layer 133 transmits the optical signal 134. Then, the conversion device 150 receives the optical signal 134, converts it into the data, and transmits the data to the image processor 140, such that the image processor 140 may perform an image data processing to the data.

Compared with the conventional method of using a conductive layer to transmit data by means of electrical signals, the image transmission system 100 of the present disclosure adopts the optical signal 134 to transmit data through the optical waveguide layer 133 of the flexible printed circuit 130. Therefore, the image transmission speed or the image transmission capacity of the image transmission system 100 of the present disclosure is increased substantially. As a result, complex data can be quickly transmitted to the image processor 140 through the optical waveguide layer 133 of the flexible printed circuit 130, such that the image processor 140 may perform an image data processing to the data, so as to improve the entire transmission and processing speed of the data. If the image transmission system 100 is introduced in electronical products, it may bring a fast/quick response experience to users.

In one embodiment, the flexible printed circuit 130 can be a highly integrated OE-FPC (Optoelectronics Flexible Printed Circuit). OE-FPC can transmit electrical signals for controlling electrical elements, and transmit optical signals 134 including carrier waves for carrying data. In another embodiment, the electrical signals can be transmitted to the conductive layer 131 through an input/output interface 113 of the image capturing device 110, and the conductive layer 131 transmits it to an input/output interface 143 of the image processor 140. It is noted that, the electrical signals can be voltage control instructions (e.g., a DC voltage with 0.5V is regard as a voltage control instruction) or electrical control instructions carried by carrier waves (e.g., control instructions in connection with electricity, which are carried by AC carrier waves). In still another embodiment, the data can be image data, electrical-related data (e.g., electrical signals) . . . etc. The conversion devices 120, 150 of the present disclosure may perform a conversion between image data and optical signals, and perform a conversion between electrical-related data (e.g., electrical signals) and optical signals. Then, the conversion devices 120, 150 transmit the optical signals converted from image data and/or electrical-related data (e.g., electrical signals) to the optical waveguide layer 133, and the optical waveguide layer 133 transmits the optical signal 134. However, the present disclosure is not limited to the above-mentioned embodiments, and it is merely an example for illustrating one of the implements of the present disclosure. It will be apparent to those skilled in the art that various modifications and variations can be made to the structure of the present disclosure without departing from the scope or spirit of the present disclosure.

In one embodiment, reference is made to both FIG. 1 and FIG. 2. The conversion device 120 includes a driver 121, a photoelectric converter 123, an optical detector 125, and an amplifier 127. In addition, the conversion device 150 includes an optical detector 151, an amplifier 153, a driver 155, and a photoelectric converter 157. In this embodiment, the detail operations of the image transmission system 100 are described below. The image capturing device 110 captures data, transmits it to the driver 121 of the conversion device 120, and the driver 121 of the conversion device 120 drives the photoelectric converter 123 to convert the data into an optical signal 134. Subsequently, the photoelectric converter 123 of the conversion device 120 transmits the optical signal 134 to the optical waveguide layer 133, and the optical waveguide layer 133 transmits the optical signal 134. Then, the optical detector 151 of the conversion device 150 detects the optical signal 134, and converts it into the data. The amplifier 153 of the conversion device 150 adjusts the data, and transmits it to the image processor 140, such that the image processor 140 may perform an image data processing to the data.

It is noted that, the image transmission system 100 of the present disclosure can perform a bidirectional transmission. For example, if image data or other kinds of data needs to be transmitted from the image processor 140 to the image capturing device 110, a data transmission can be performed through the driver 155, the photoelectric converter 157, the optical waveguide layer 133, the optical detector 125, and the amplifier 127, so as to achieve a bidirectional transmission of the image transmission system 100 of the present disclosure.

In one embodiment, the driver 121 and the driver 155 can be semiconductor laser drivers (LD). The photoelectric converter 123 and the photoelectric converter 157 can be semiconductor lasers. The optical detector 125 and the optical detector 151 can be photodetectors (PD). However, the present disclosure is not limited to the above-mentioned embodiments, and it is merely an example for illustrating one of the implements of the present disclosure. It will be apparent to those skilled in the art that various modifications and variations can be made to the structure of the present disclosure without departing from the scope or spirit of the present disclosure.

In one embodiment, reference is made to both FIG. 1 and FIG. 2, the image capturing device 110 includes a serializing/deserializing circuit 111, and the image processor 140 includes a serializing/deserializing circuit 141. In this embodiment, the detail operations of the image transmission system 100 are described below. The image capturing device 110 captures data, the serializing/deserializing circuit 111 of the image capturing device 110 convers the parallel data into the serial data, and the conversion device 120 converts the serial data into the optical signal 134. Subsequently, the conversion device 120 transmits the optical signal 134 to the optical waveguide layer 133, and the optical waveguide layer 133 transmits the optical signal 134. Then, the conversion device 150 receives the optical signal 134, converts it into the serial data, and transmits the serial data to the image processor 140. Besides, the serializing/deserializing circuit 141 of the image processor 140 converts the serial data into the parallel data, such that the image processor 140 may perform an image data processing to the parallel data. The image transmission system 100 of the present disclosure adopts the serializing/deserializing circuits 111, 141 to convert parallel data into serial data with high transmission speed. As a result, numbers of pins of the image transmission system 100 of the present disclosure can be limited. Therefore, the numbers of the pins can be reduced efficiently, so as to decrease numbers of transmission lines and interference, such that an excellent solution for image transmission with high speed is provided.

In one embodiment, the serializing/deserializing circuits 111, 141 can be Serializer/Deserializers (SerDes). However, the present disclosure is not limited to the above-mentioned embodiments, and it is merely an example for illustrating one of the implements of the present disclosure. It will be apparent to those skilled in the art that various modifications and variations can be made to the structure of the present disclosure without departing from the scope or spirit of the present disclosure.

In one embodiment, the image capturing device 110, the conversion devices 120, 150, and the image processor 140 are disposed on the flexible printed circuit 130. In another embodiment, the image transmission system 100 further includes a supporting layer 115, and the supporting layer 115 is used to support the image capturing device 110, which is disposed above the supporting layer 115, and part of the flexible printed circuit 130. In addition, the image transmission system 100 further includes another supporting layer 145, and the supporting layer 145 is used to support the image processor 140, which is disposed above the supporting layer 145, and part of the flexible printed circuit 130. However, the present disclosure is not limited to the above-mentioned embodiments, and it is merely an example for illustrating one of the implements of the present disclosure.

Figure 3:
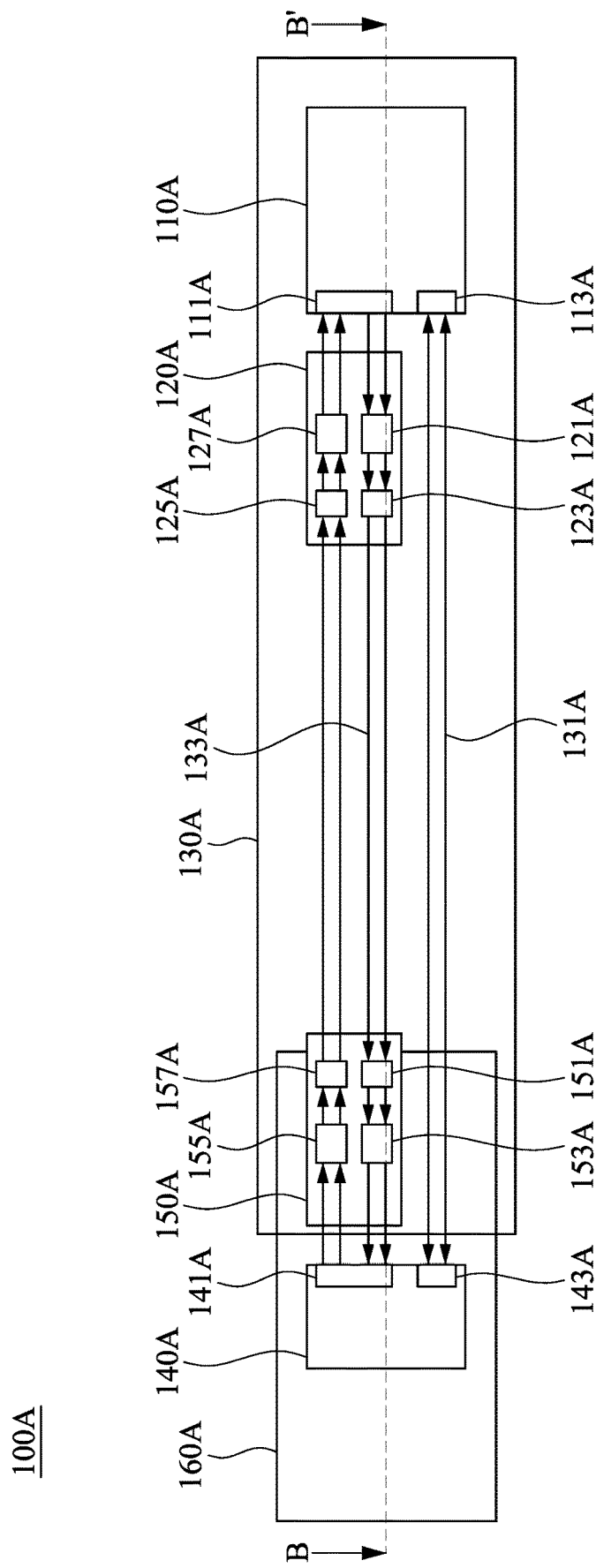
FIG. 3 depicts a schematic diagram of an image transmission system according to one embodiment of the present disclosure.

FIG. 3 depicts a schematic diagram of an image transmission system 100A according to one embodiment of the present disclosure. Compared with the image transmission system 100 shown in FIG. 1, the image transmission system 100A shown in FIG. 3 further includes a substrate 160A.

Figure 4:
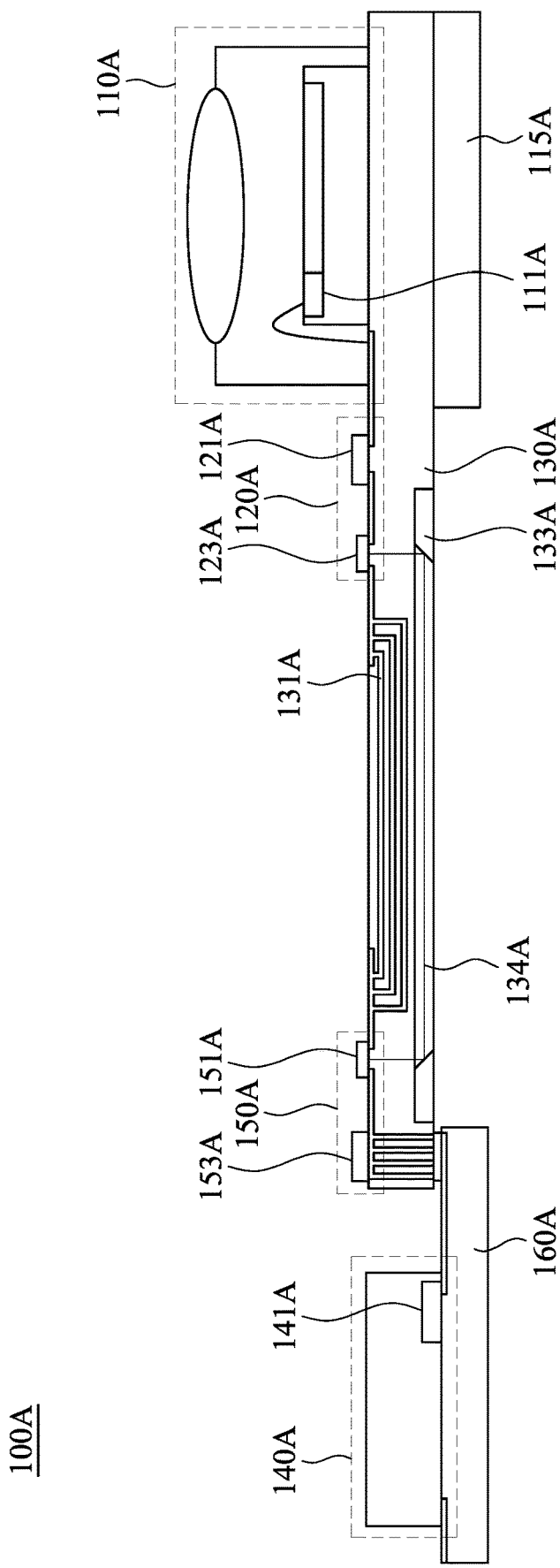
FIG. 4 depicts a schematic diagram of a cross-sectional view of the image transmission system shown in FIG. 3 according to one embodiment of the present disclosure.

For facilitating the understanding of the structure of the image transmission system 100A shown in FIG. 3, reference is now made to FIG. 4. FIG. 4 depicts a schematic diagram of a cross-sectional view along line BB' of the image transmission system 100A shown in FIG. 3 according to one embodiment of the present disclosure. As shown in the figure, the substrate 160A is connected to the flexible printed circuit 130A, and the substrate 160A is configured to dispose the image processor 140A. In addition, the image capturing device 110A and the conversion devices 120A, 150A are disposed on the flexible printed circuit 130A. It is noted that, the element in FIG. 3 and FIG. 4, whose symbol is similar to the symbol of the element in FIG. 1 and FIG. 2, has similar structure feature in connection with the element in FIG. 1 and FIG. 2. Therefore, a detail description regarding the structure feature of the element in FIG. 3 and FIG. 4 is omitted herein for the sake of brevity. Furthermore, the present disclosure is not limited to the structure as shown in FIG. 3 and FIG. 4, and it is merely an example for illustrating one of the implements of the present disclosure.

Figure 5:
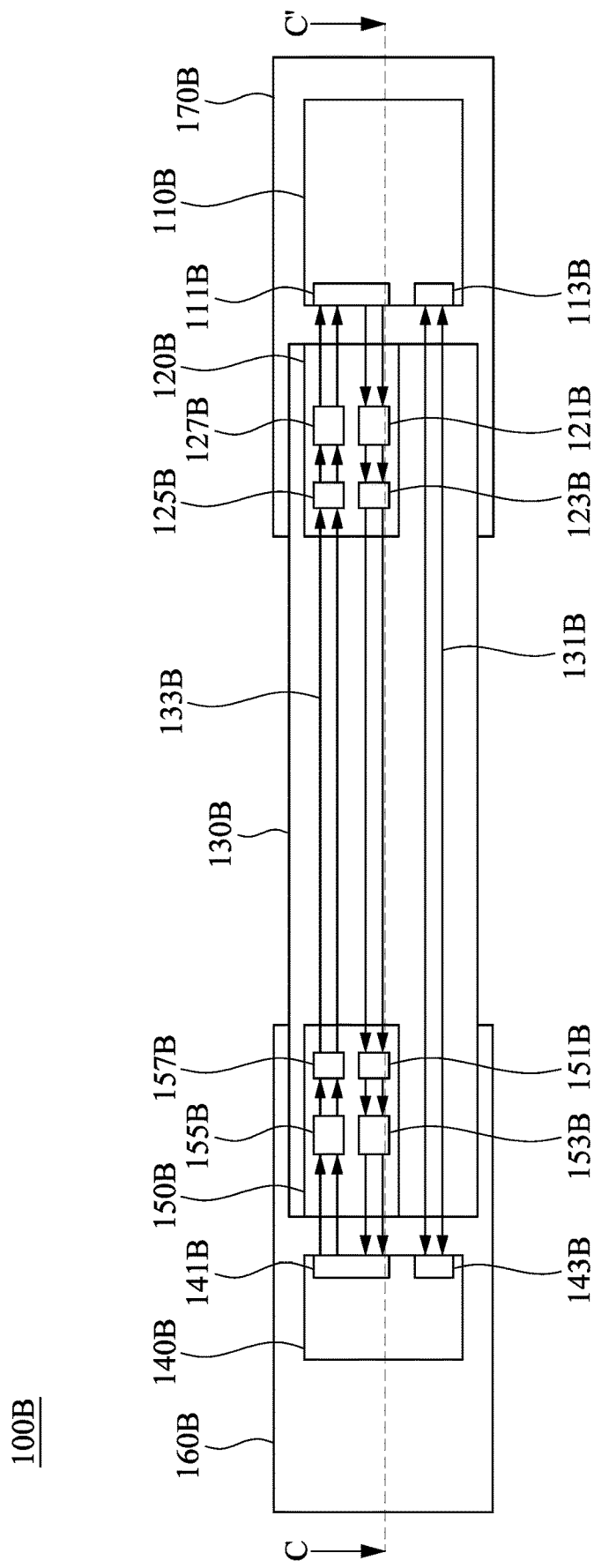
FIG. 5 depicts a schematic diagram of an image transmission system according to one embodiment of the present disclosure.

FIG. 5 depicts a schematic diagram of an image transmission system 100B according to one embodiment of the present disclosure. Compared with the image transmission system 100 shown in FIG. 1, the image transmission system 100B shown in FIG. 5 further includes a substrate 160B and a substrate 170B.

Figure 6:
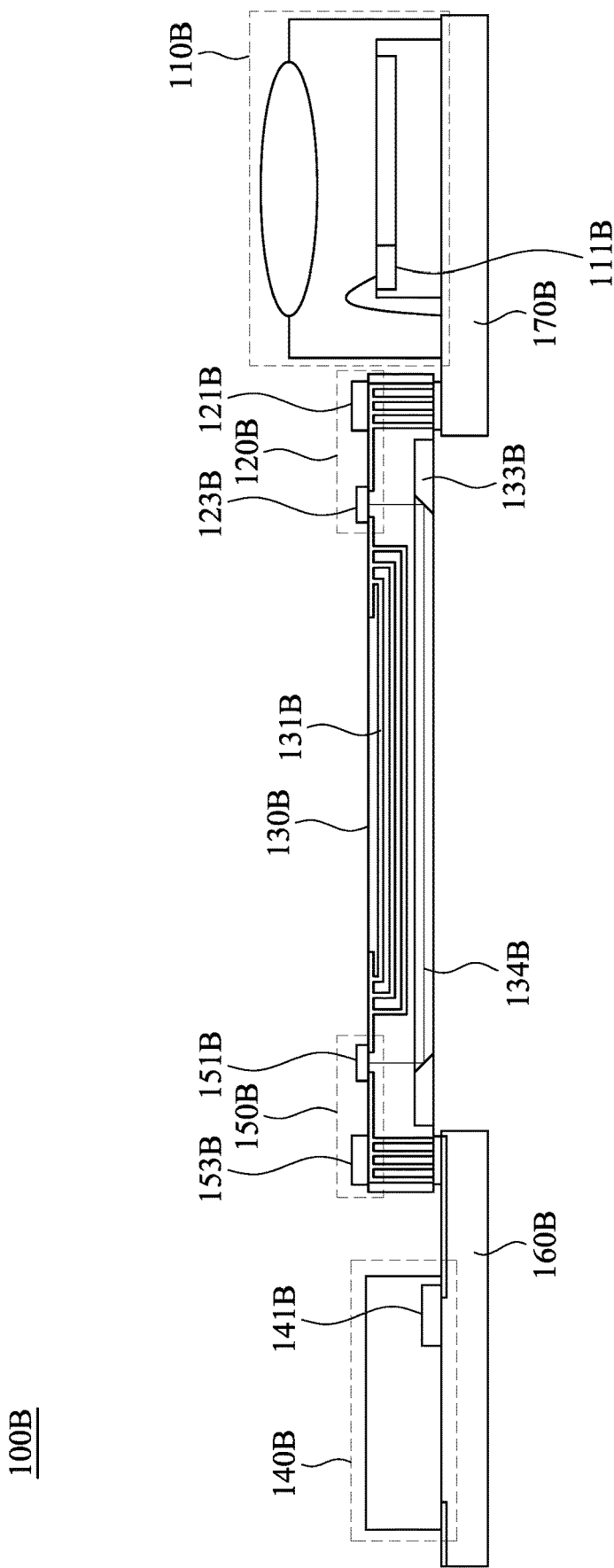
FIG. 6 depicts a schematic diagram of a cross-sectional view of the image transmission system shown in FIG. 5 according to one embodiment of the present disclosure.

For facilitating the understanding of the structure of the image transmission system 100B shown in FIG. 5, reference is now made to FIG. 6. FIG. 6 depicts a schematic diagram of a cross-sectional view along line CC' of the image transmission system 100B shown in FIG. 5 according to one embodiment of the present disclosure. As shown in the figure, the substrate 160B is connected to the flexible printed circuit 130B, and the substrate 160B is configured to dispose the image processor 140B. In addition, the substrate 170B is connected to the flexible printed circuit 130B, and the substrate 170B is configured to dispose the image capturing device 110B. Besides, the conversion devices 120B, 150B are disposed on the flexible printed circuit 130B. It is noted that, the element in FIG. 5 and FIG. 6, whose symbol is similar to the symbol of the element in FIG. 1 and FIG. 2, has similar structure feature in connection with the element in FIG. 1 and FIG. 2. Therefore, a detail description regarding the structure feature of the element in FIG. 5 and FIG. 6 is omitted herein for the sake of brevity. Furthermore, the present disclosure is not limited to the structure as shown in FIG. 5 and FIG. 6, and it is merely an example for illustrating one of the implements of the present disclosure.

Figure 7:
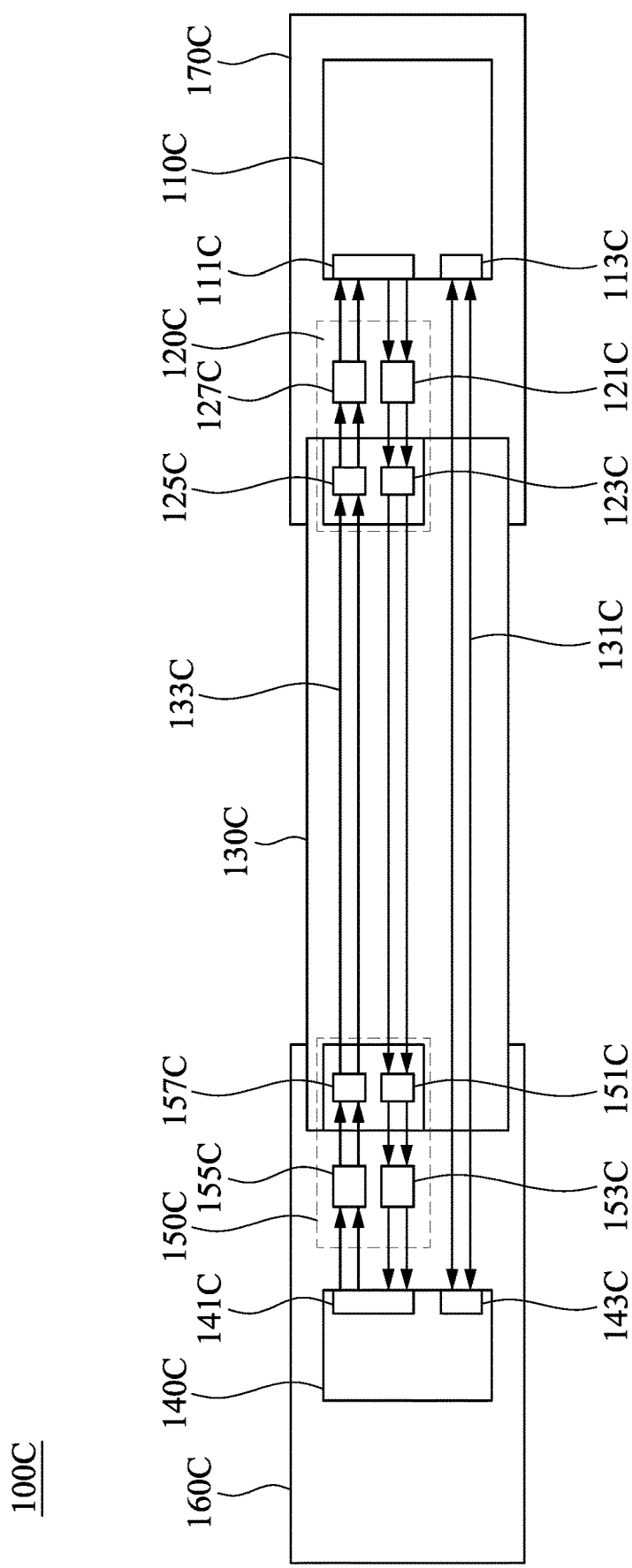
FIG. 7 depicts a schematic diagram of an image transmission system according to one embodiment of the present disclosure.

FIG. 7 depicts a schematic diagram of an image transmission system 100C according to one embodiment of the present disclosure. Compared with the image transmission system 100 shown in FIG. 1, the image transmission system 100C shown in FIG. 7 further includes a substrate 160C and a substrate 170C.

As shown in FIG. 7, the substrate 160C is connected to the flexible printed circuit 130C, and the substrate 160C is configured to dispose the image processor 140C and the amplifier 153C and the driver 155C of the conversion device 150C. In addition, the substrate 170C is connected to the flexible printed circuit 130C, and the substrate 170C is configured to dispose the image capturing device 110C and the driver 121C and the amplifier 127C of the conversion device 120C. Besides, the photoelectric converter 123C and the optical detector 125C of the conversion device 120C are disposed on the flexible printed circuit 130C, and the optical detector 151C and the photoelectric converter 157C of the conversion device 150C are disposed on the flexible printed circuit 130C. It is noted that, the element in FIG. 7, whose symbol is similar to the symbol of the element in FIG. 1, has similar structure feature in connection with the element in FIG. 1. Therefore, a detail description regarding the structure feature of the element in FIG. 7 is omitted herein for the sake of brevity. Furthermore, the present disclosure is not limited to the structure as shown in FIG. 7, and it is merely an example for illustrating one of the implements of the present disclosure.

Figure 8:
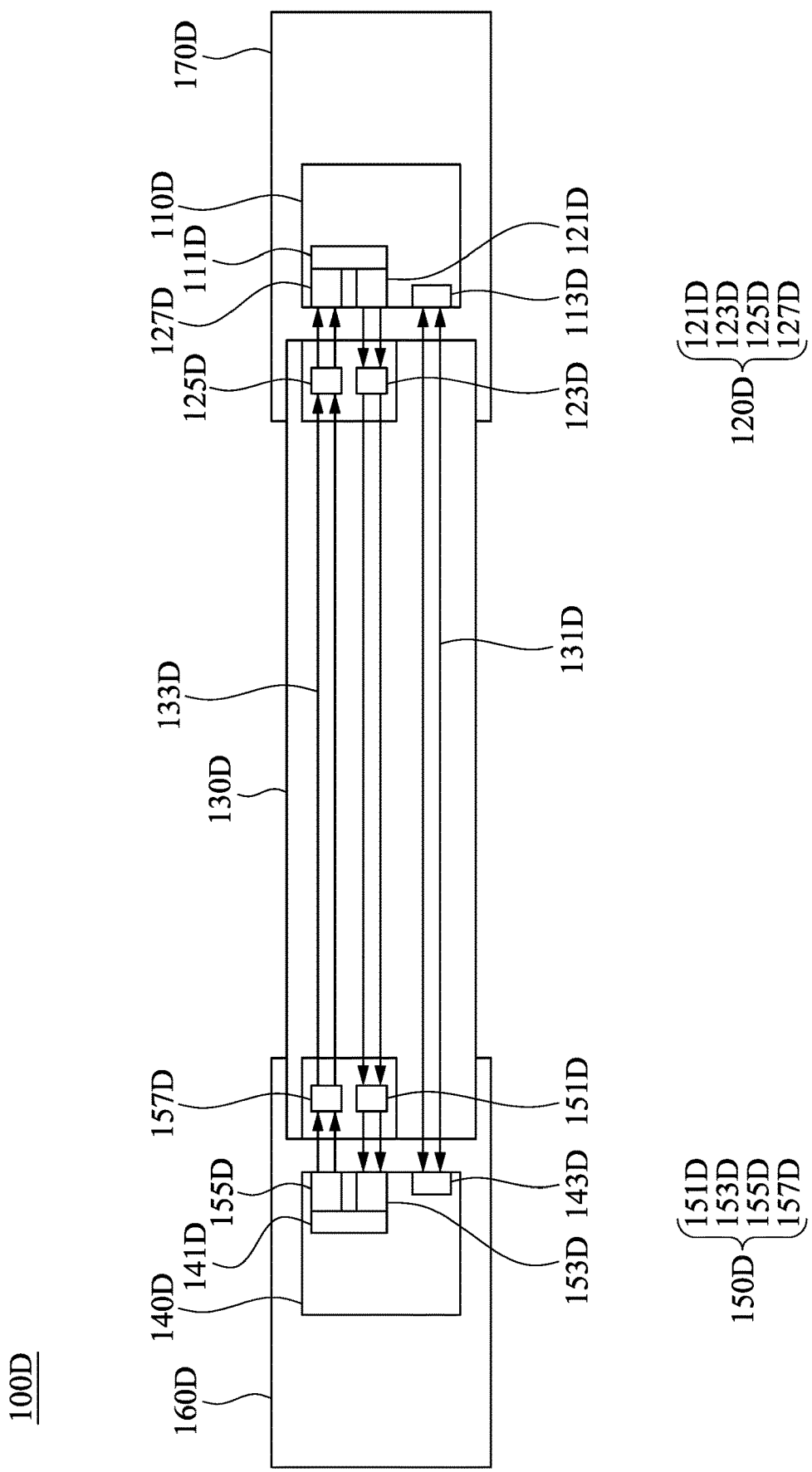
FIG. 8 depicts a schematic diagram of an image transmission system according to one embodiment of the present disclosure.

FIG. 8 depicts a schematic diagram of an image transmission system 100D according to one embodiment of the present disclosure. Compared with the image transmission system 100C shown in FIG. 7, the amplifier 153D and the driver 155D of the conversion device 150D of the image transmission system 100D shown in FIG. 8 are internally installed in the image processor 140D, and the driver 121D and the amplifier 127D of the conversion device 120D are internally installed in the image capturing device 110D. It is noted that, the element in 8, whose symbol is similar to the symbol of the element in FIG. 7, has similar structure feature in connection with the element in FIG. 7. Therefore, a detail description regarding the structure feature of the element in FIG. 8 is omitted herein for the sake of brevity. Furthermore, the present disclosure is not limited to the structure as shown in FIG. 8, and it is merely an example for illustrating one of the implements of the present disclosure.

Figure 9:
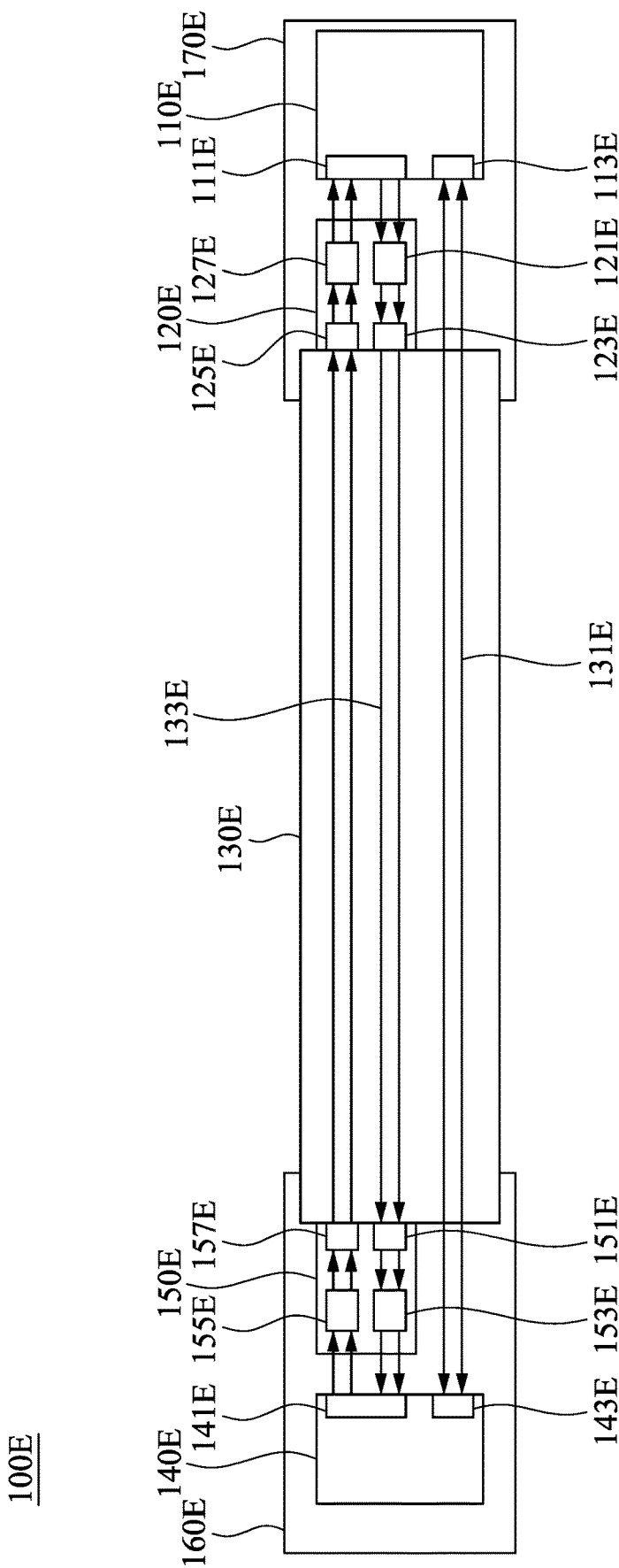
FIG. 9 depicts a schematic diagram of an image transmission system according to one embodiment of the present disclosure.

FIG. 9 depicts a schematic diagram of an image transmission system 100E according to one embodiment of the present disclosure. Compared with the image transmission system 100 shown in FIG. 1, the image transmission system 100E shown in FIG. 9 further includes a substrate 160E and a substrate 170E.

As shown in FIG. 9, the substrate 160E is connected to the flexible printed circuit 130E, and the substrate 160E is configured to dispose the image processor 140E and the conversion device 150E. In addition, the substrate 170E is connected to the flexible printed circuit 130E, and the substrate 170E is configured to dispose the image capturing device 110E and the conversion device 120E. It is noted that, the element in FIG. 9, whose symbol is similar to the symbol of the element in FIG. 1, has similar structure feature in connection with the element in FIG. 1. Therefore, a detail description regarding the structure feature of the element in FIG. 9 is omitted herein for the sake of brevity. Furthermore, the present disclosure is not limited to the structure as shown in FIG. 9, and it is merely an example for illustrating one of the implements of the present disclosure.

Figure 10:
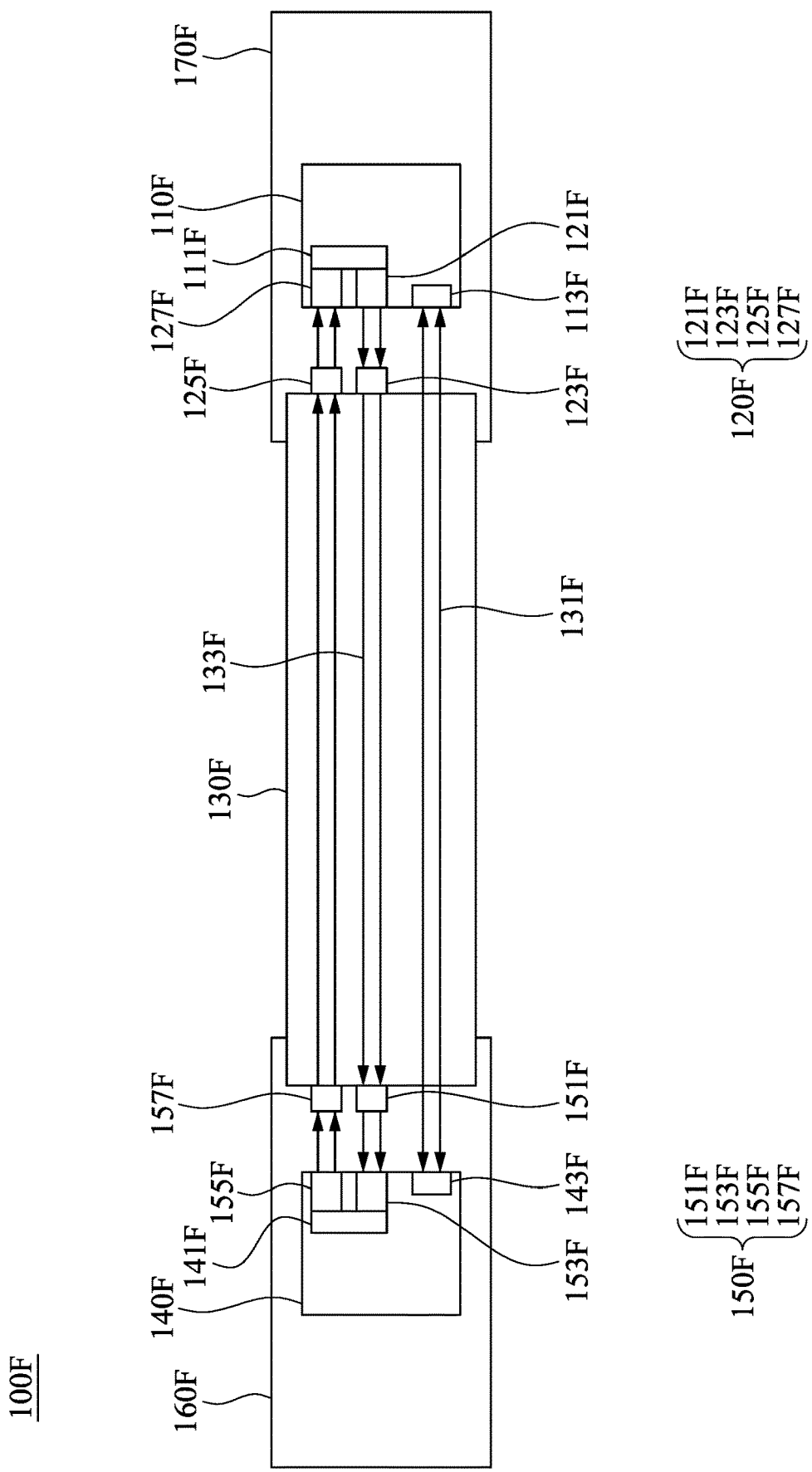
FIG. 10 depicts a schematic diagram of an image transmission system according to one embodiment of the present disclosure.

FIG. 10 depicts a schematic diagram of an image transmission system 100F according to one embodiment of the present disclosure. Compared with the image transmission system 100E shown in FIG. 9, the amplifier 153F and the driver 155F of the conversion device 150F of the image transmission system 100F shown in FIG. 10 are internally installed in the image processor 140F, and the driver 121F and the amplifier 127F of the conversion device 120F are internally installed in the image capturing device 110F. It is noted that, the element in FIG. 10, whose symbol is similar to the symbol of the element in FIG. 9, has similar structure feature in connection with the element in FIG. 9. Therefore, a detail description regarding the structure feature of the element in FIG. 10 is omitted herein for the sake of brevity. Furthermore, the present disclosure is not limited to the structure as shown in FIG. 10, and it is merely an example for illustrating one of the implements of the present disclosure.

Figure 11:
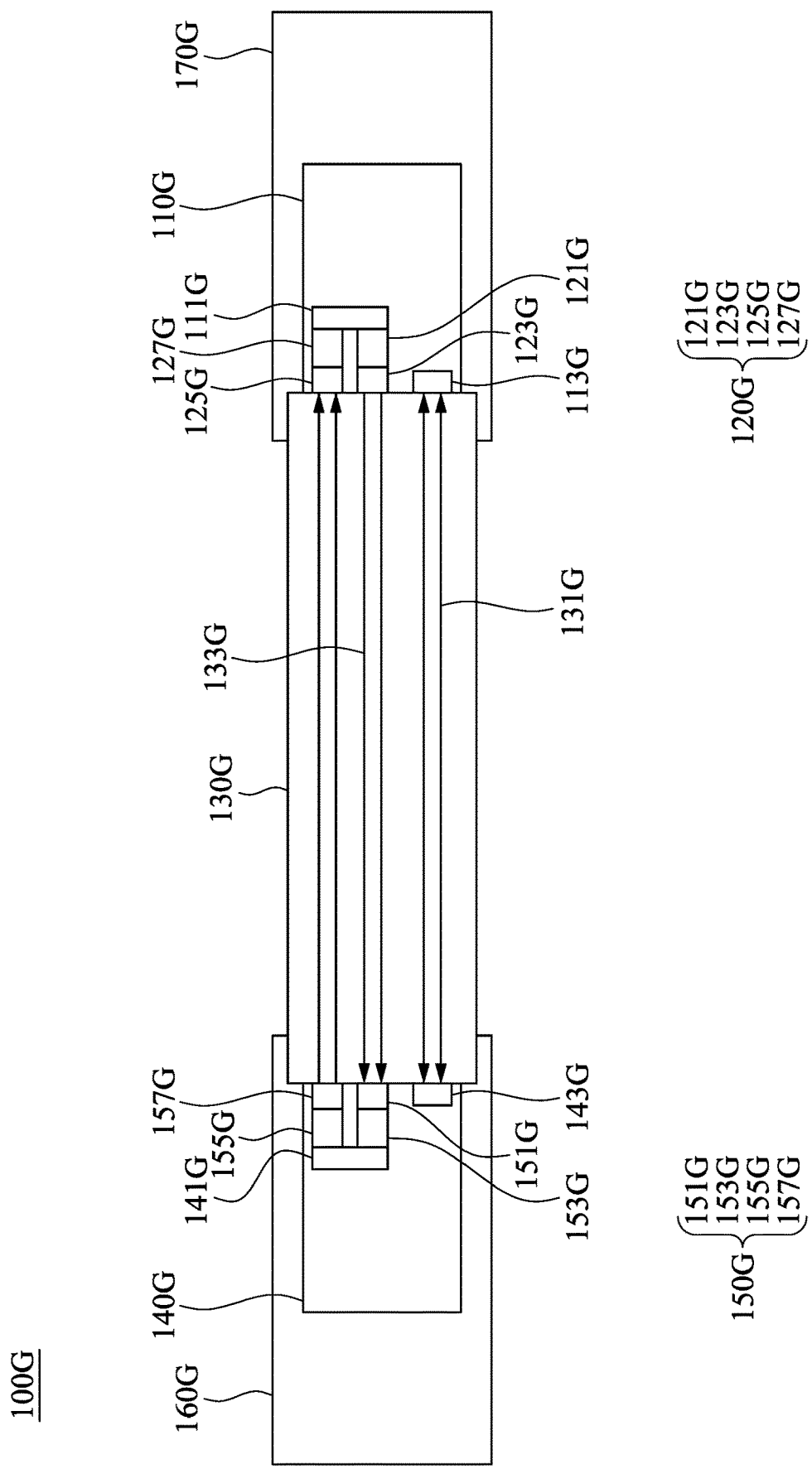
FIG. 11 depicts a schematic diagram of an image transmission system according to one embodiment of the present disclosure.

FIG. 11 depicts a schematic diagram of an image transmission system 100G according to one embodiment of the present disclosure. Compared with the image transmission system 100E shown in FIG. 9, the conversion device 150G of the image transmission system 100G shown in FIG. 11 is internally installed in the image processor 140G, and the conversion device 120G is internally installed in the image capturing device 110G. It is noted that, the element in FIG. 11, whose symbol is similar to the symbol of the element in FIG. 9, has similar structure feature in connection with the element in FIG. 9. Therefore, a detail description regarding the structure feature of the element in FIG. 11 is omitted herein for the sake of brevity. Furthermore, the present disclosure is not limited to the structure as shown in FIG. 11, and it is merely an example for illustrating one of the implements of the present disclosure.

Figure 12:
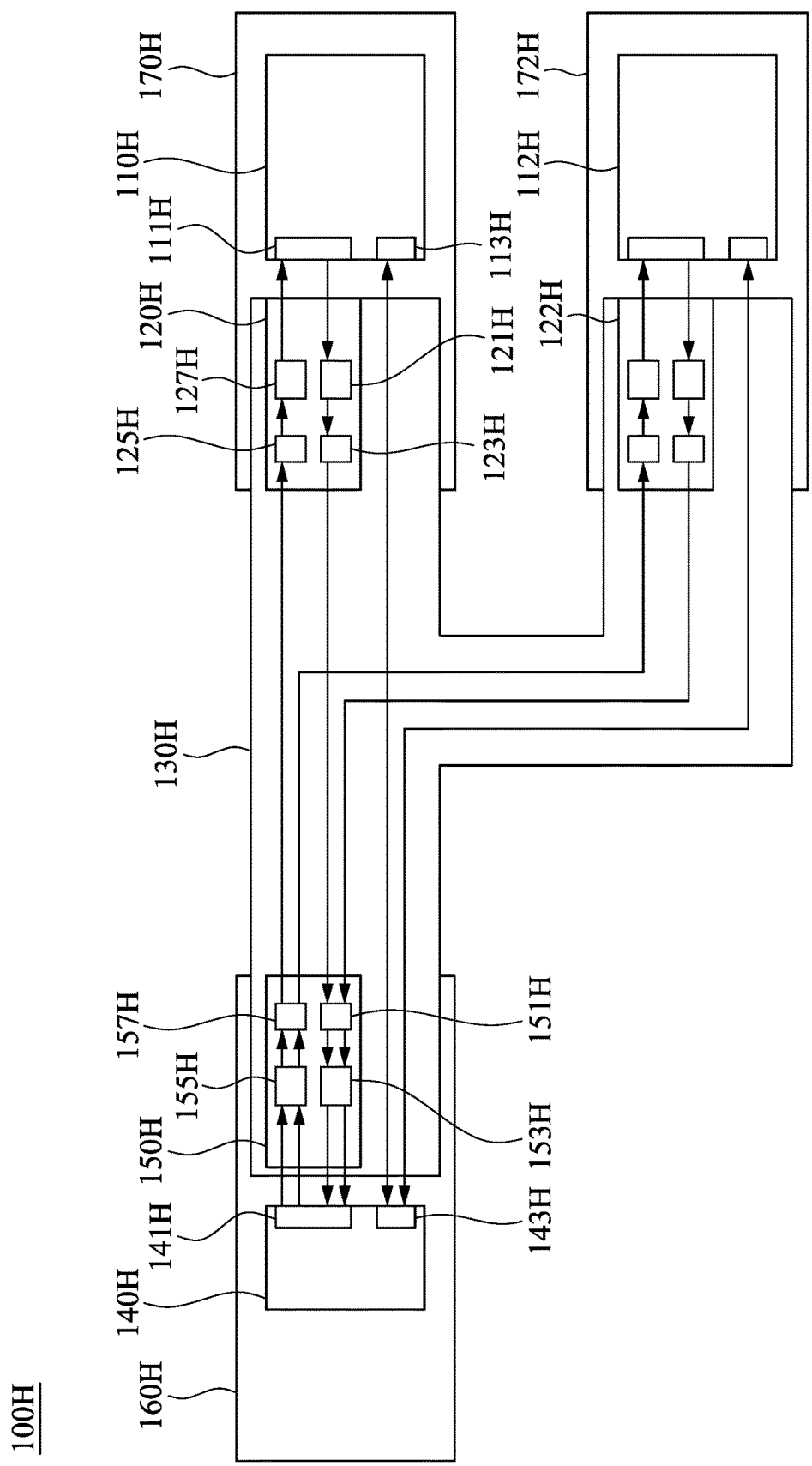
FIG. 12 depicts a schematic diagram of an image transmission system according to one embodiment of the present disclosure.

FIG. 12 depicts a schematic diagram of an image transmission system 100H according to one embodiment of the present disclosure. Compared with the image transmission system 100B shown in FIG. 5, the image transmission system 100H shown in FIG. 12 further includes an image capturing device 112H and a substrate 172H. In addition, the flexible printed circuit 130H includes a first connection terminal and a second connection terminal.

As shown in the figure, the image capturing device 110H is connected to the first connection terminal (e.g., the upper right terminal of the flexible printed circuit 130H) of the flexible printed circuit 130H, and the image capturing device 112H is connected to the second connection terminal (e.g., the lower right terminal of the flexible printed circuit 130H) of the flexible printed circuit 130H. Besides, the image processor 140H is connected to the third connection terminal (e.g., the left terminal of the flexible printed circuit 130H) of the flexible printed circuit 130H. In addition, the substrate 172H is connected to the second connection terminal (e.g., e.g., the lower right terminal of the flexible printed circuit 130H) of the flexible printed circuit 130H, and configured to dispose the image capturing device 112H. It is noted that, the element in FIG. 12, whose symbol is similar to the symbol of the element in FIG. 5, has similar structure feature in connection with the element in FIG. 5. Therefore, a detail description regarding the structure feature of the element in FIG. 12 is omitted herein for the sake of brevity. Furthermore, the present disclosure is not limited to the structure as shown in FIG. 12, and it is merely an example for illustrating one of the implements of the present disclosure.

Figure 13:
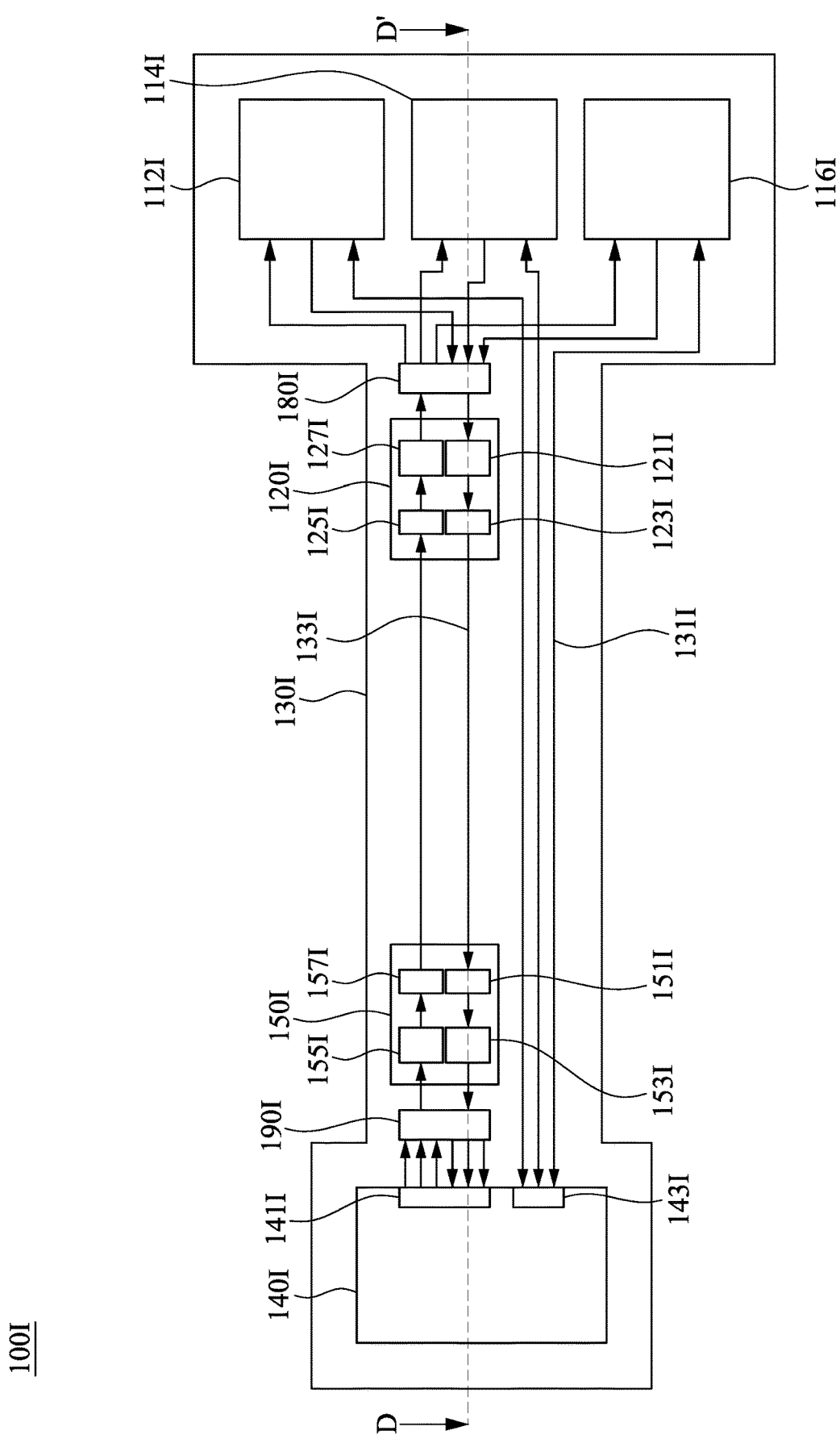
FIG. 13 depicts a schematic diagram of an image transmission system according to one embodiment of the present disclosure.

FIG. 13 depicts a schematic diagram of an image transmission system 100I according to one embodiment of the present disclosure. As shown in the figure, the image transmission system 100I includes a plurality of image capturing devices 112I, 114I, 116I, a conversion device 120I, a flexible printed circuit 130I, an image processor 140I, a conversion device 150I, a serializing/deserializing circuit 180I, and a serializing/deserializing circuit 190I.

Figure 14:
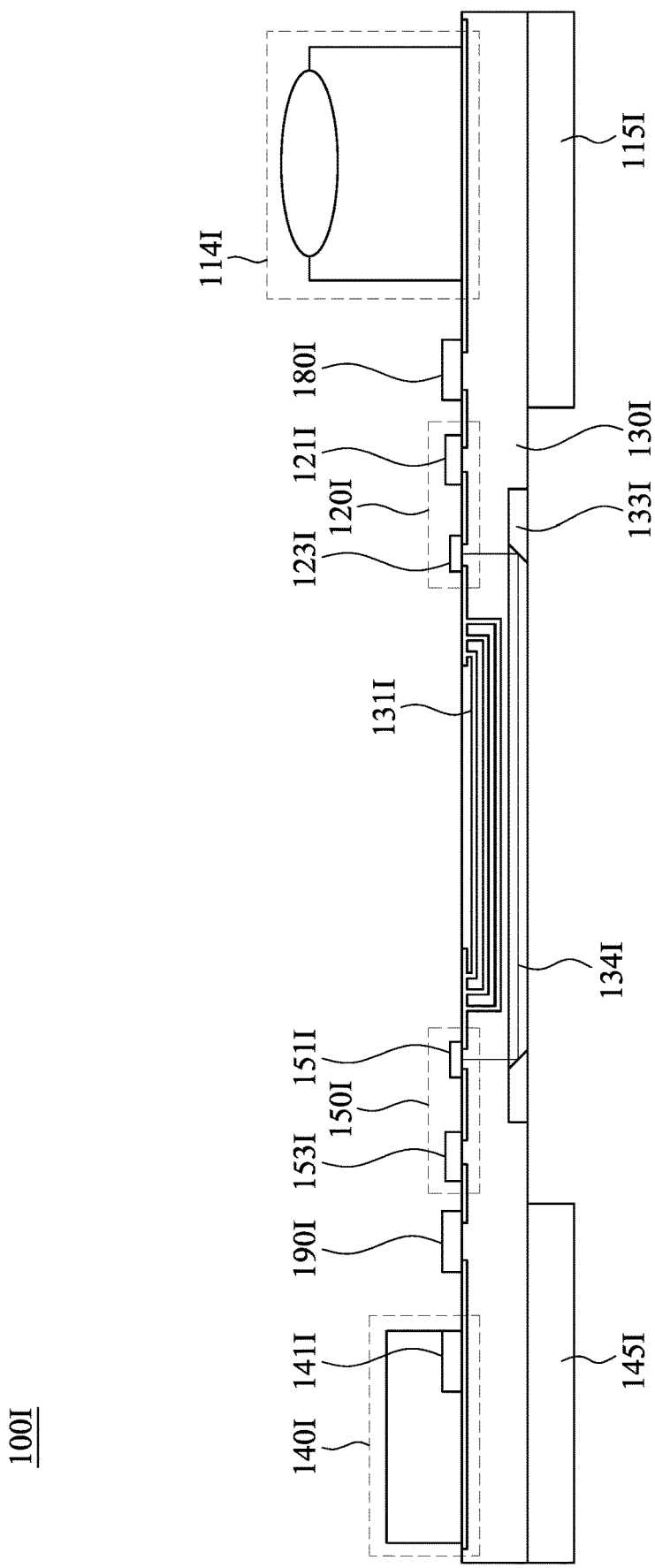
FIG. 14 depicts a schematic diagram of a cross-sectional view of the image transmission system shown in FIG. 13 according to one embodiment of the present disclosure.

For facilitating the understanding of the structure of the image transmission system 100I shown in FIG. 13, reference is now made to FIG. 14. FIG. 14 depicts a schematic diagram of a cross-sectional view along line DD' of the image transmission system 100I shown in FIG. 13 according to one embodiment of the present disclosure. As shown in the figure, the flexible printed circuit 130I includes a conductive layer 131I and an optical waveguide layer 133I.

For facilitating the understanding of the operation of the image transmission system 100I, reference is made to both FIG. 13 and FIG. 14. A plurality of image capturing devices 112I, 114I, 116I capture multiple data (e.g., parallel data), and transmit the parallel data to the serializing/deserializing circuit 180I. The serializing/deserializing circuit 180I converts the parallel data into the serial data, and the conversion device 120I converts the serial data into the optical signal 134I. Subsequently, the conversion device 120I transmits the optical signal 134I to the optical waveguide layer 133I, and the optical waveguide layer 133I transmits the optical signal 134I. Then, the conversion device 150I receives the optical signal 134I, converts it into the serial data, and transmits the serial data to the serializing/deserializing circuit 190I. Besides, the serializing/deserializing circuit 190I converts the serial data into the data (e.g., the parallel data), such that the image processor 140I performs subsequent image-related processing on data.

Compared with the conventional method of using a conductive layer to transmit data by means of electrical signals, the image transmission system 100I of the present disclosure adopts the optical waveguide layer 133I of the flexible printed circuit 130I to transmit data by means of optical signal 134I. Therefore, the image transmission speed or the image transmission capacity of the image transmission system 100I of the present disclosure is increased substantially, such that the data can be transmitted to the image processor 140I fast so as to improve the entire transmission and processing speed of the data. If the image transmission system 100I is introduced in electronical products, it may bring a fast/quick response experience to users. In addition, the image transmission system 100I of the present disclosure adopts the serializing/deserializing circuits 180I, 190I to convert parallel data into serial data with high transmission speed. As a result, numbers of pins of the image transmission system 100I of the present disclosure can be limited. Therefore, the numbers of the pins of the image transmission system 100I of the present disclosure can be reduced efficiently, so as to decrease numbers of transmission lines and interference, such that an excellent solution for image transmission with high speed is provided.

In one embodiment, the flexible printed circuit 130I shown in FIG. 13 and FIG. 14 can be a highly integrated OE-FPC (Optoelectronics Flexible Printed Circuit). OE-FPC can transmit electrical signals for controlling electrical elements, and transmit optical signals 134I including carrier waves for carrying data. It is noted that, the electrical signals can be voltage control instructions (e.g., a DC voltage with 0.5V is regard as a voltage control instruction) or electrical control instructions carried by carrier waves (e.g., control instructions in connection with electricity, which are carried by AC carrier waves). In still another embodiment, the serializing/deserializing circuits 180I, 190I of the present disclosure may perform a conversion between image data and serial data, and perform a conversion between electrical signals and serial data. In another embodiment, the serializing/deserializing circuits 180I, 190I shown in FIG. 13 and FIG. 14 can be Serializer/Deserializers (SerDes). However, the present disclosure is not limited to the above-mentioned embodiments, and it is merely an example for illustrating one of the implements of the present disclosure. It will be apparent to those skilled in the art that various modifications and variations can be made to the structure of the present disclosure without departing from the scope or spirit of the present disclosure.

In one embodiment, reference is made to both FIG. 13 and FIG. 14. The conversion device 120I includes a driver 121I, a photoelectric converter 123I, an optical detector 125I, and an amplifier 127I. In addition, the conversion device 150I includes an optical detector 151I, an amplifier 153I, a driver 155I, and a photoelectric converter 157I. In this embodiment, the detail operations of the image transmission system 100I are described below. A plurality of image capturing devices 112I, 114I, 116I capture multiple data (e.g., parallel data), and transmit the parallel data to the serializing/deserializing circuit 180I. The serializing/deserializing circuit 180I converts the parallel data into the serial data, and the driver 121I of the conversion device 120I drives the photoelectric converter 123I to convert the serial data into the optical signal 134I. Subsequently, the photoelectric converter 123I of the conversion device 120I transmits the optical signal 134I to the optical waveguide layer 133I, and the optical waveguide layer 133I transmits the optical signal 134I. Then, the optical detector 151I of the conversion device 150I detects the optical signal 134I, and converts it into the serial data. The amplifier 153I of the conversion device 150I adjusts the serial data, and transmits it to the serializing/deserializing circuit 190I. Besides, the serializing/deserializing circuit 190I converts the serial data into data (e.g., parallel data), such that the image processor 140I may perform an image data processing to the data.

In one embodiment, the driver 121I and the driver 155I shown in FIG. 13 and FIG. 14 can be semiconductor laser drivers (LD). The photoelectric converter 123I and the photoelectric converter 157I can be semiconductor lasers. The optical detector 125I and the optical detector 151I can be photodetectors (PD). However, the present disclosure is not limited to the above-mentioned embodiments, and it is merely an example for illustrating one of the implements of the present disclosure. It will be apparent to those skilled in the art that various modifications and variations can be made to the structure of the present disclosure without departing from the scope or spirit of the present disclosure.

In one embodiment, the image capturing devices 112I, 114I, 116I, the serializing/deserializing circuits 180I, 190I, the conversion devices 120I, 150I, and the image processor 140I are disposed on the flexible printed circuit 130I. However, the present disclosure is not limited to the above-mentioned embodiments, and it is merely an example for illustrating one of the implements of the present disclosure.

Figure 15:
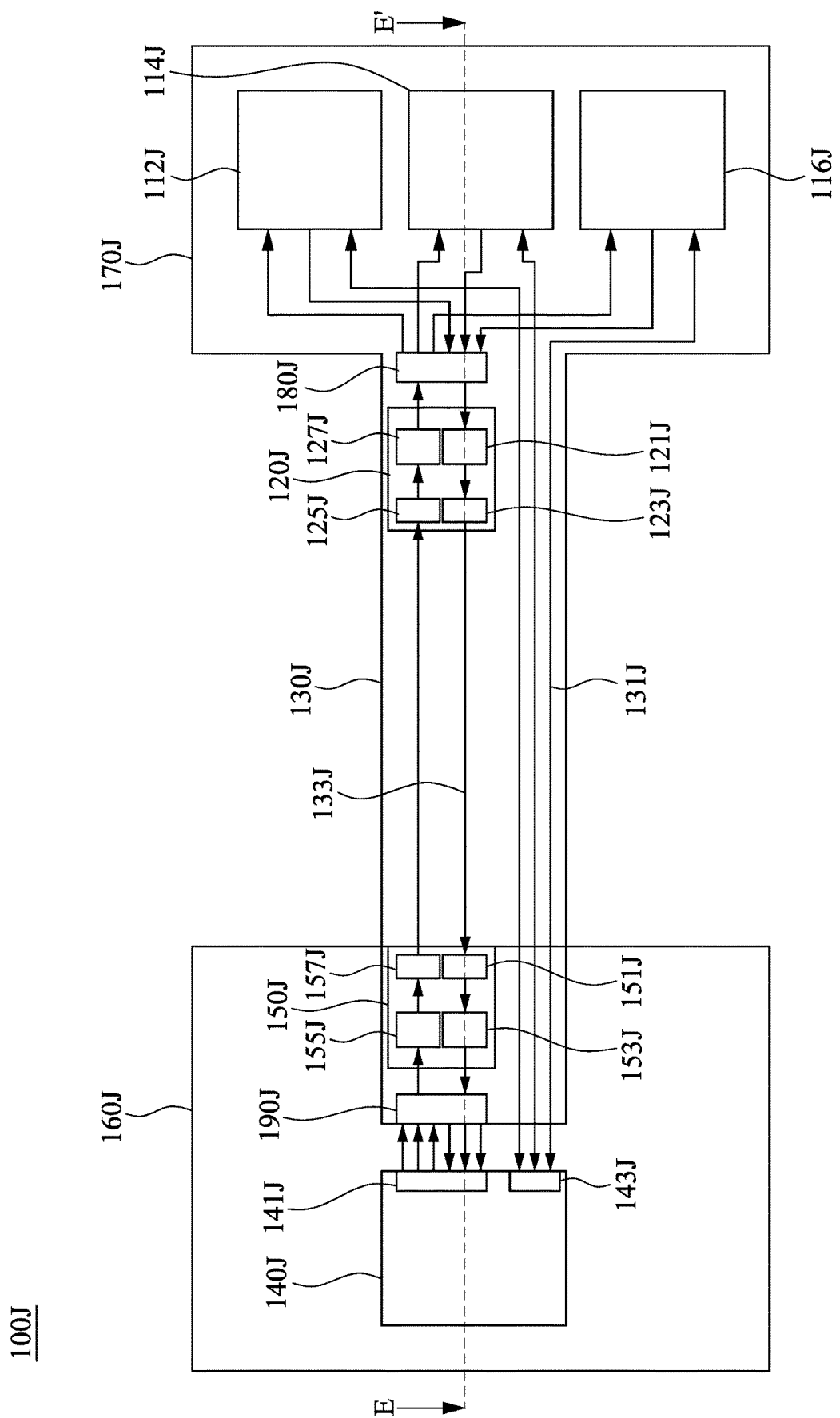
FIG. 15 depicts a schematic diagram of an image transmission system according to one embodiment of the present disclosure.

FIG. 15 depicts a schematic diagram of an image transmission system 100J according to one embodiment of the present disclosure. Compared with the image transmission system 100I shown in FIG. 13, the image transmission system 100J shown in FIG. 15 further includes a substrate 160J.

Figure 16:
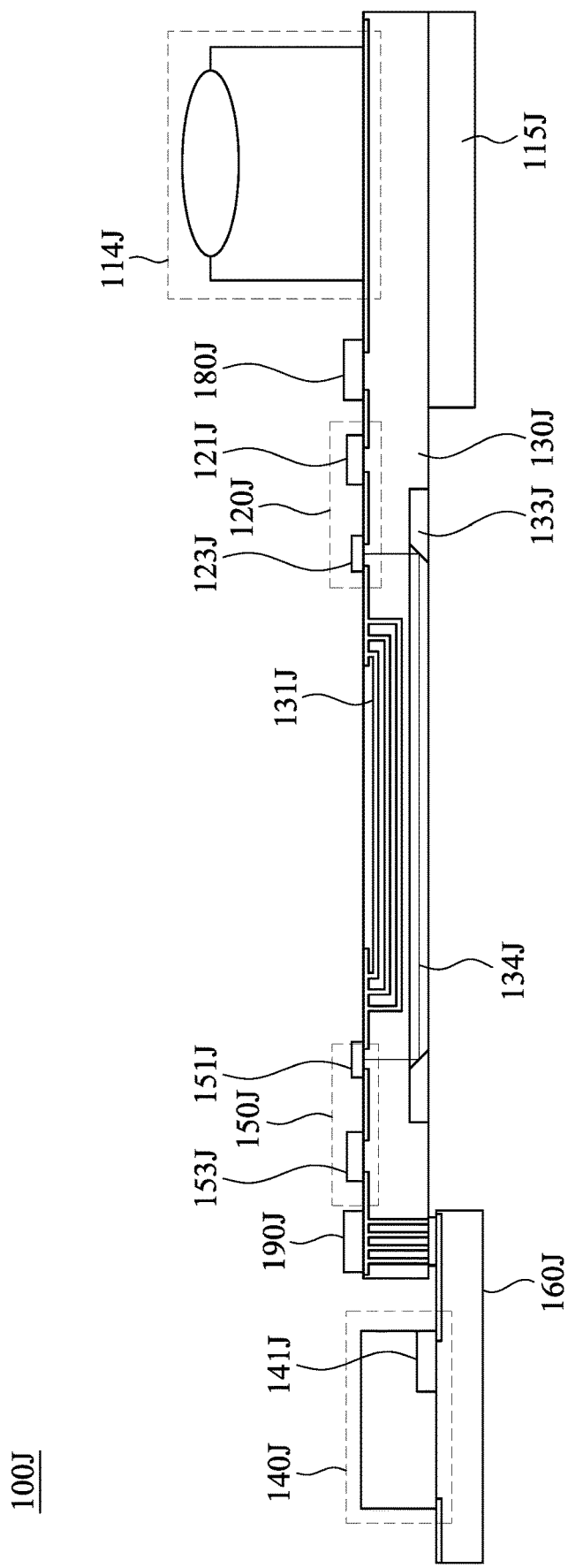
FIG. 16 depicts a schematic diagram of a cross-sectional view of the image transmission system shown in FIG. 15 according to one embodiment of the present disclosure.

For facilitating the understanding of the structure of the image transmission system 100J shown in FIG. 15, reference is now made to FIG. 16. FIG. 16 depicts a schematic diagram of a cross-sectional view along line EE' of the image transmission system 100J shown in FIG. 15 according to one embodiment of the present disclosure. As shown in the figure, the substrate 160J is connected to the flexible printed circuit 130J, and the substrate 160J is configured to dispose the image processor 140J. In addition, the image capturing devices 112J, 114J, 116J, the serializing/deserializing circuits 180I, 190I, and the conversion devices 120J, 150J are disposed on the flexible printed circuit 130J. It is noted that, the element in FIG. 15 and FIG. 16, whose symbol is similar to the symbol of the element in FIG. 13 and FIG. 14, has similar structure feature in connection with the element in FIG. 13 and FIG. 14. Therefore, a detail description regarding the structure feature of the element in FIG. 15 and FIG. 16 is omitted herein for the sake of brevity. Furthermore, the present disclosure is not limited to the structure as shown in FIG. 15 and FIG. 16, and it is merely an example for illustrating one of the implements of the present disclosure.

Figure 17:
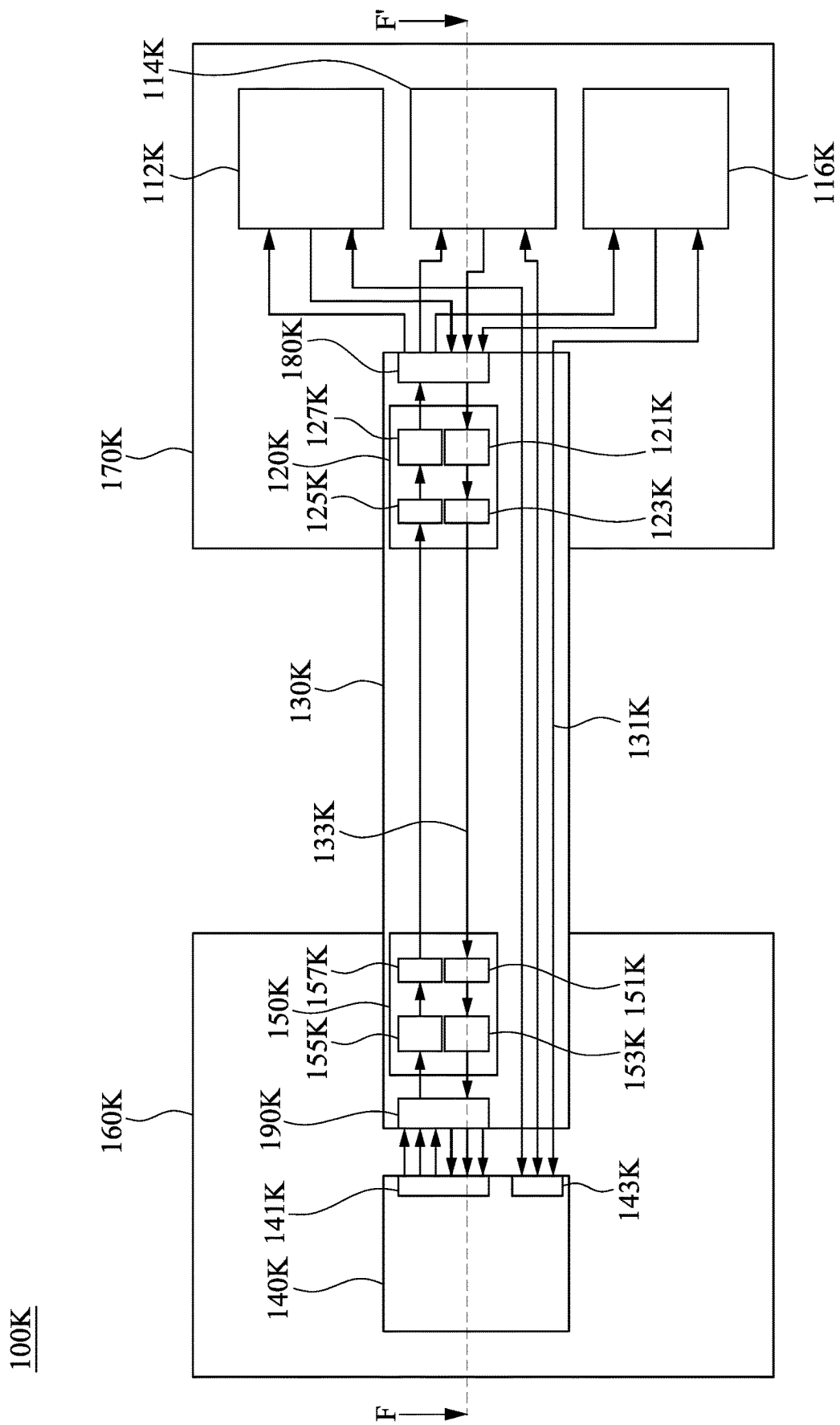
FIG. 17 depicts a schematic diagram of an image transmission system according to one embodiment of the present disclosure.

FIG. 17 depicts a schematic diagram of an image transmission system 100K according to one embodiment of the present disclosure. Compared with the image transmission system 100I shown in FIG. 13, the image transmission system 100K shown in FIG. 17 further includes a substrate 160K and a substrate 170K.

Figure 18:
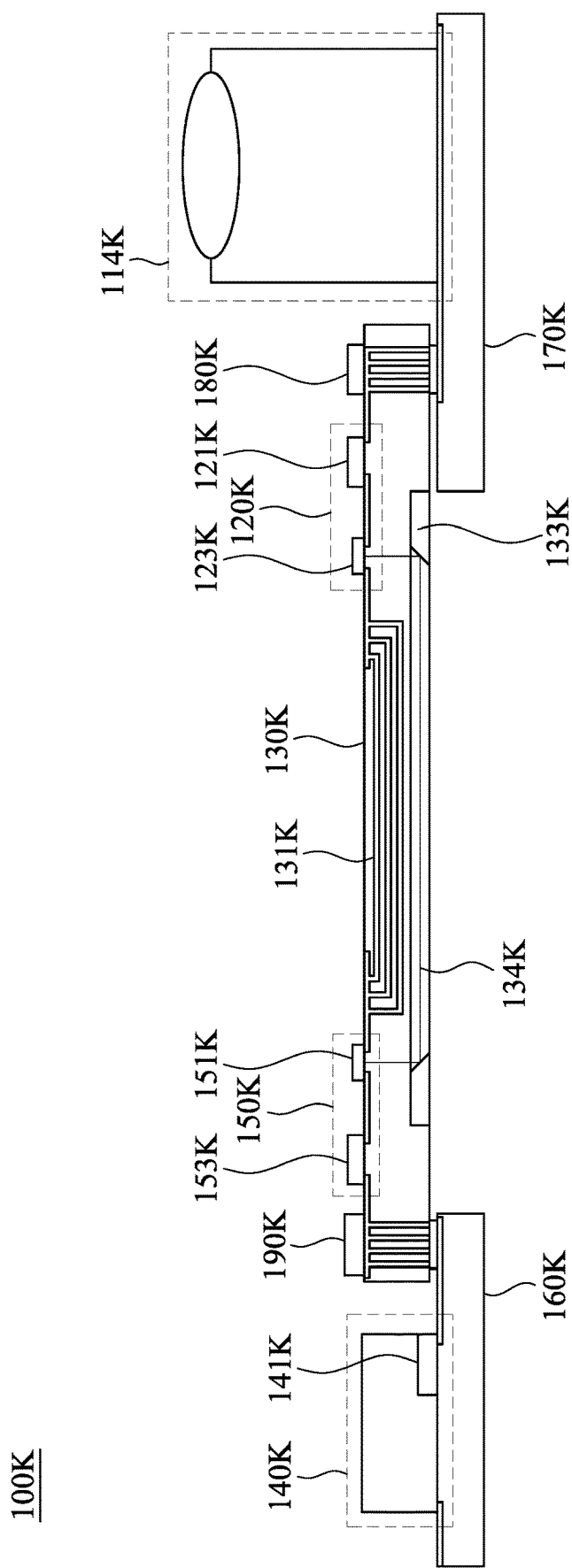
FIG. 18 depicts a schematic diagram of a cross-sectional view of the image transmission system shown in FIG. 17 according to one embodiment of the present disclosure.

For facilitating the understanding of the structure of the image transmission system 100K shown in FIG. 17, reference is now made to FIG. 18. FIG. 18 depicts a schematic diagram of a cross-sectional view along line FF' of the image transmission system 100K shown in FIG. 17 according to one embodiment of the present disclosure. As shown in the figure, the substrate 160K is connected to the flexible printed circuit 130K, and the substrate 160K is configured to dispose the image processor 140K. In addition, the substrate 170K is connected to the flexible printed circuit 130K, and the substrate 170K is configured to dispose the image capturing devices 112K, 114K, 116K. Besides, the serializing/deserializing circuits 180K, 190K and the conversion devices 120K, 150K are disposed on the flexible printed circuit 130K. It is noted that, the element in FIG. 17 and FIG. 18, whose symbol is similar to the symbol of the element in FIG. 13 and FIG. 14, has similar structure feature in connection with the element in FIG. 13 and FIG. 14. Therefore, a detail description regarding the structure feature of the element in FIG. 17 and FIG. 18 is omitted herein for the sake of brevity. Furthermore, the present disclosure is not limited to the structure as shown in FIG. 17 and FIG. 18, and it is merely an example for illustrating one of the implements of the present disclosure.

Figure 19:
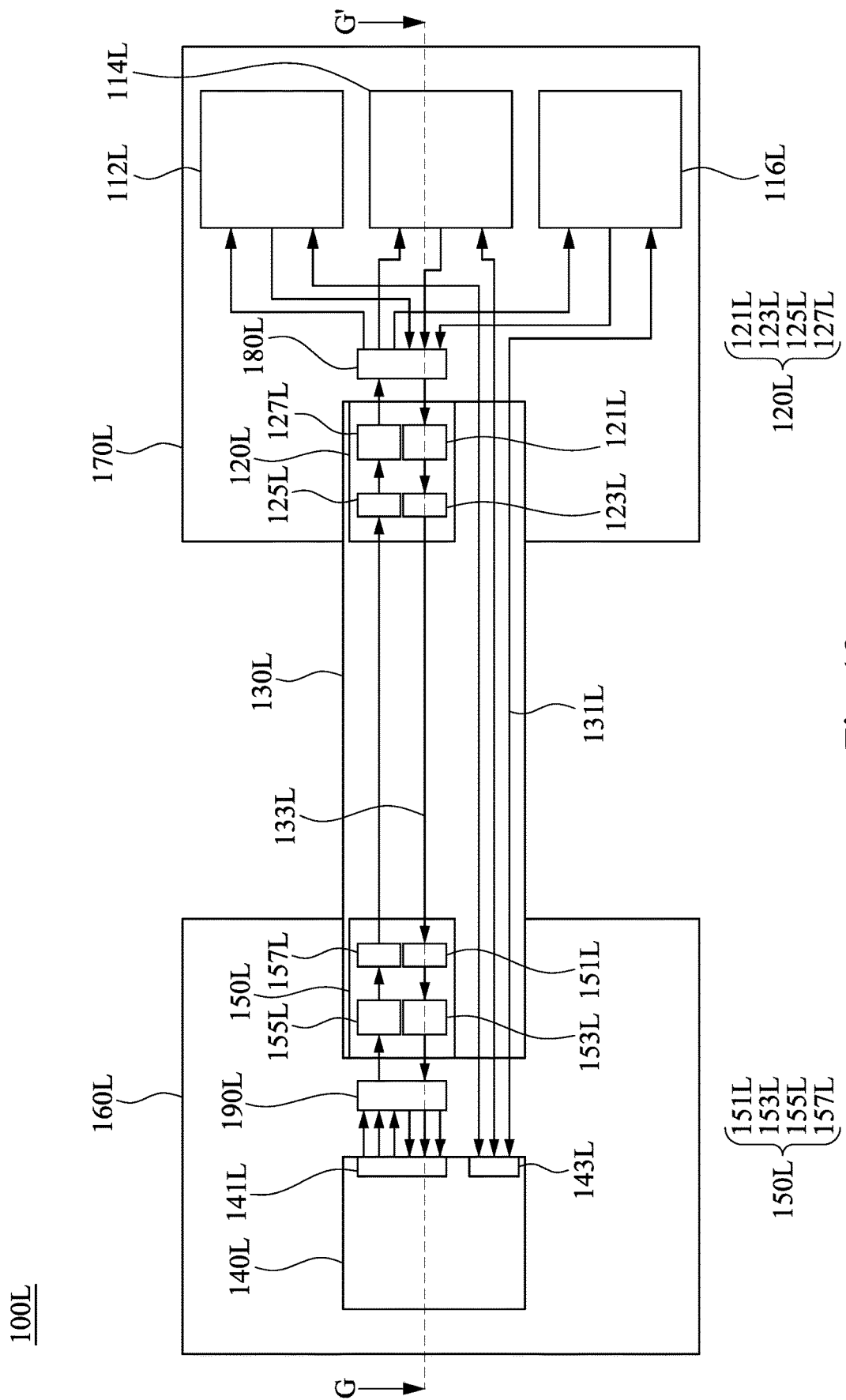
FIG. 19 depicts a schematic diagram of an image transmission system according to one embodiment of the present disclosure.

FIG. 19 depicts a schematic diagram of an image transmission system 100L according to one embodiment of the present disclosure. Compared with the image transmission system 100I shown in FIG. 13, the image transmission system 100L shown in FIG. 19 further includes a substrate 160L and a substrate 170L.

Figure 20:
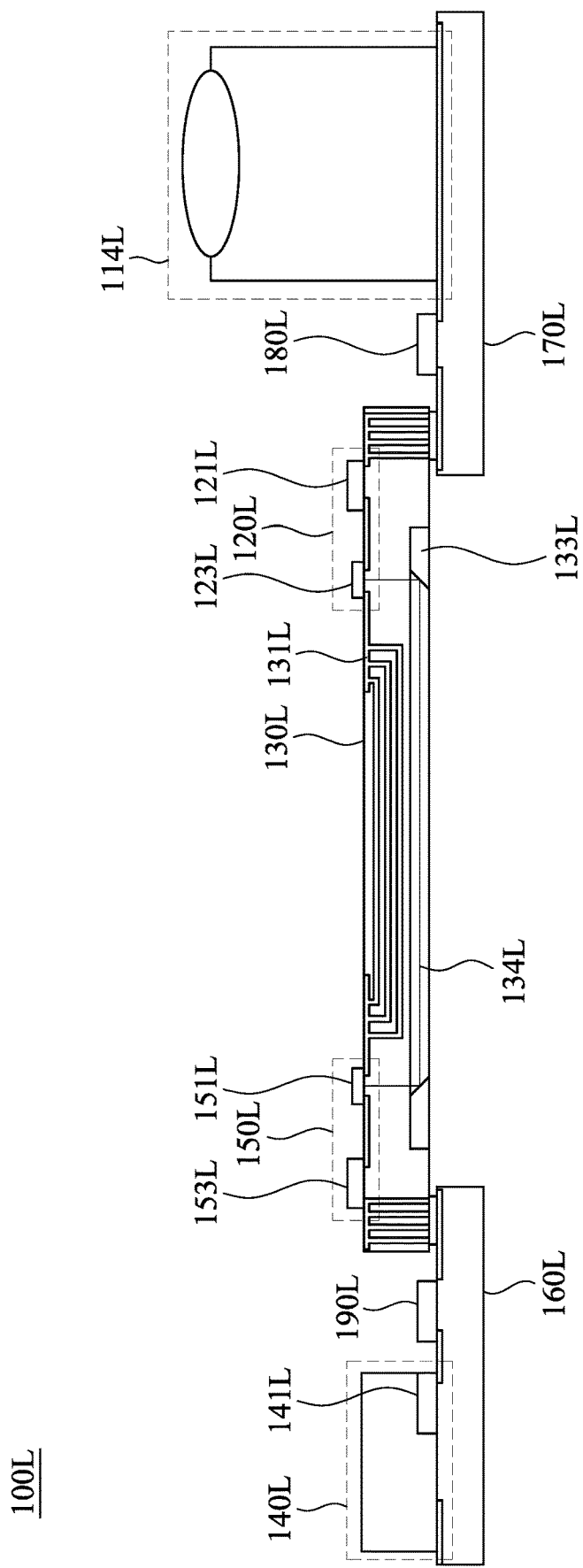
FIG. 20 depicts a schematic diagram of a cross-sectional view of the image transmission system shown in FIG. 19 according to one embodiment of the present disclosure.

For facilitating the understanding of the structure of the image transmission system 100L shown in FIG. 19, reference is now made to FIG. 20. FIG. 20 depicts a schematic diagram of a cross-sectional view along line GG' of the image transmission system 100L shown in FIG. 19 according to one embodiment of the present disclosure. As shown in the figure, the substrate 160L is connected to the flexible printed circuit 130L, and the substrate 160L is configured to dispose the image processor 140L and the serializing/deserializing circuit 190L. In addition, the substrate 170L is connected to the flexible printed circuit 130L, and the substrate 170L is configured to dispose the image capturing devices 112L, 114L, 116L and the serializing/deserializing circuit 180L. Besides, the conversion devices 120L, 150L are disposed on the flexible printed circuit 130L. It is noted that, the element in FIG. 19 and FIG. 20, whose symbol is similar to the symbol of the element in FIG. 13 and FIG. 14, has similar structure feature in connection with the element in FIG. 13 and FIG. 14. Therefore, a detail description regarding the structure feature of the element in FIG. 19 and FIG. 20 is omitted herein for the sake of brevity. Furthermore, the present disclosure is not limited to the structure as shown in FIG. 19 and FIG. 20, and it is merely an example for illustrating one of the implements of the present disclosure.

Figure 21:
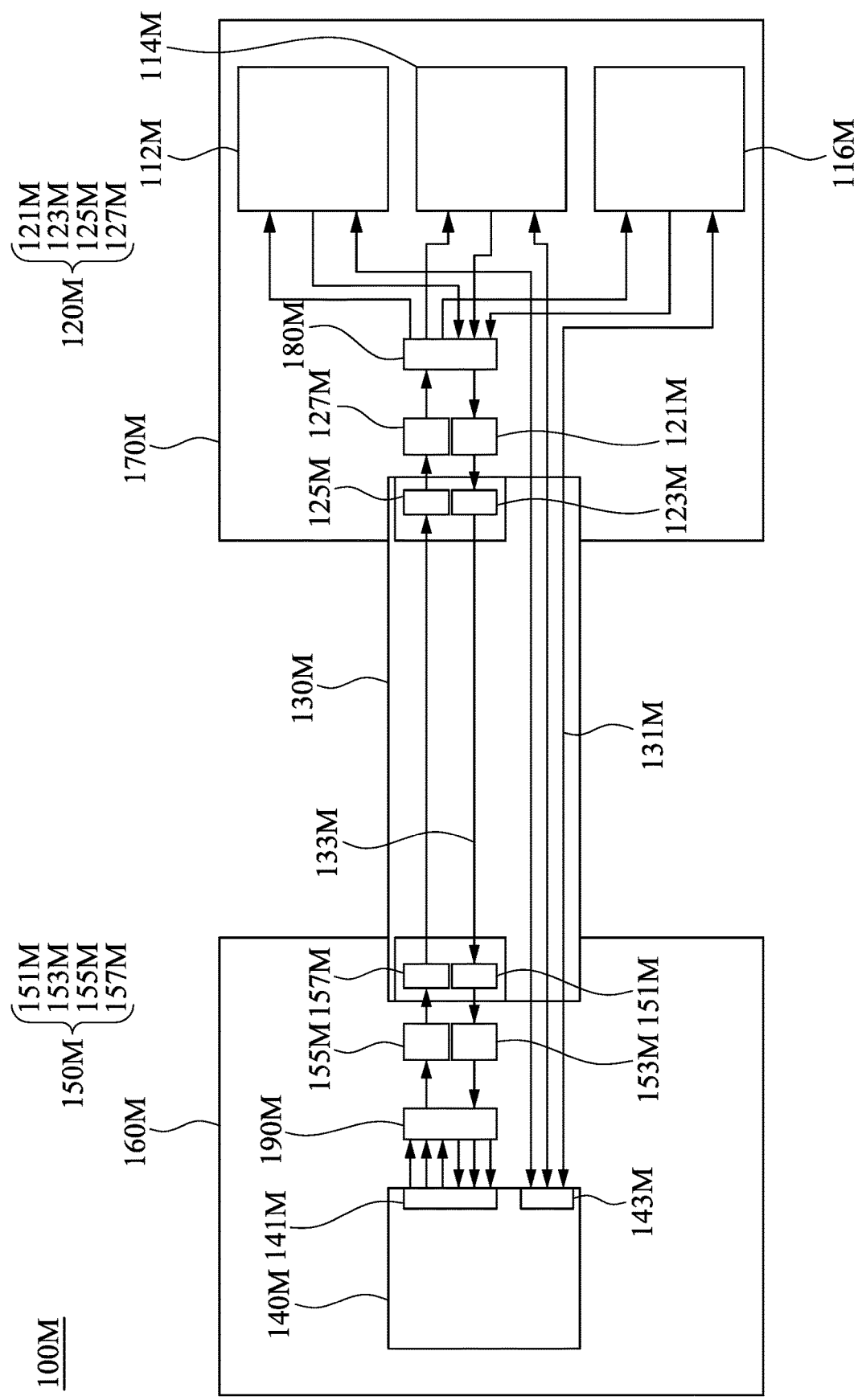
FIG. 21 depicts a schematic diagram of an image transmission system according to one embodiment of the present disclosure.

FIG. 21 depicts a schematic diagram of an image transmission system 100M according to one embodiment of the present disclosure. Compared with the image transmission system 100I shown in FIG. 13, the image transmission system 100M shown in FIG. 21 further includes a substrate 160M and a substrate 170M.

As shown in FIG. 21, the substrate 160M is connected to the flexible printed circuit 130M, and the substrate 160M is configured to dispose the image processor 140M and the amplifier 153M and the driver 155M of the conversion device 150M. In addition, the substrate 170M is connected to the flexible printed circuit 130M, and the substrate 170M is configured to dispose the image capturing devices 112M, 114M, 116M and the driver 121M and the amplifier 127M of the conversion device 120M. Besides, the photoelectric converter 123M and the optical detector 125M of the conversion device 120M are disposed on the flexible printed circuit 130M, and the optical detector 151M and the photoelectric converter 157M of the conversion device 150M are disposed on the flexible printed circuit 130M. It is noted that, the element in FIG. 21, whose symbol is similar to the symbol of the element in FIG. 13, has similar structure feature in connection with the element in FIG. 13. Therefore, a detail description regarding the structure feature of the element in FIG. 21 is omitted herein for the sake of brevity. Furthermore, the present disclosure is not limited to the structure as shown in FIG. 21, and it is merely an example for illustrating one of the implements of the present disclosure.

Figure 22:
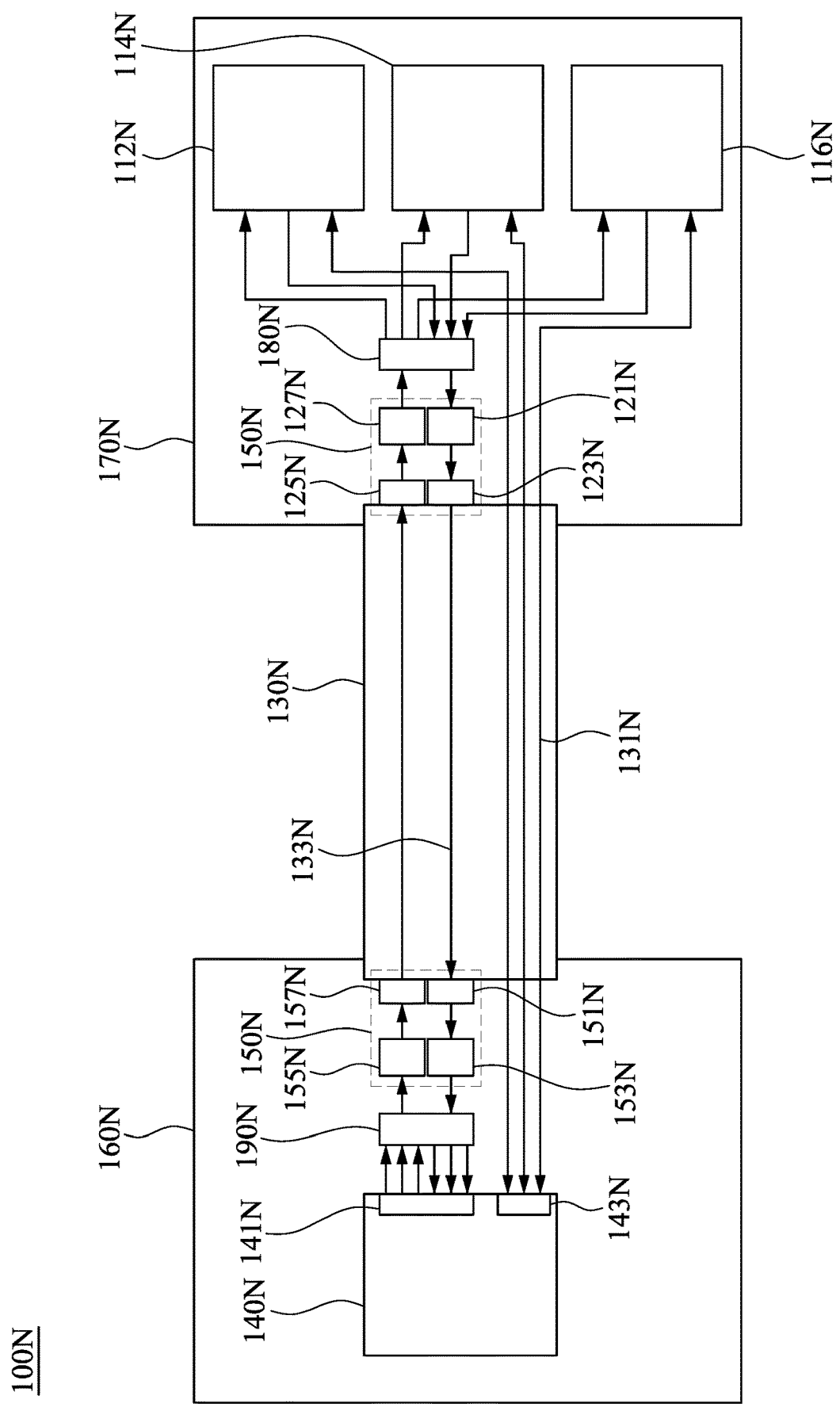
FIG. 22 depicts a schematic diagram of an image transmission system according to one embodiment of the present disclosure.

FIG. 22 depicts a schematic diagram of an image transmission system 100N according to one embodiment of the present disclosure. Compared with the image transmission system 100I shown in FIG. 13, the image transmission system 100N shown in FIG. 22 further includes a substrate 160N and a substrate 170N.

As shown in FIG. 22, the substrate 160N is connected to the flexible printed circuit 130N, and the substrate 160N is configured to dispose the image processor 140N, the serializing/deserializing circuit 190N, and the conversion device 150N. In addition, the substrate 170N is connected to the flexible printed circuit 130N, and the substrate 170N is configured to dispose the image capturing devices 112N, 114N, 116N, the serializing/deserializing circuit 180N, and the conversion device 120N. It is noted that, the element in FIG. 22, whose symbol is similar to the symbol of the element in FIG. 13, has similar structure feature in connection with the element in FIG. 13. Therefore, a detail description regarding the structure feature of the element in FIG. 22 is omitted herein for the sake of brevity. Furthermore, the present disclosure is not limited to the structure as shown in FIG. 22, and it is merely an example for illustrating one of the implements of the present disclosure.

Figure 23:
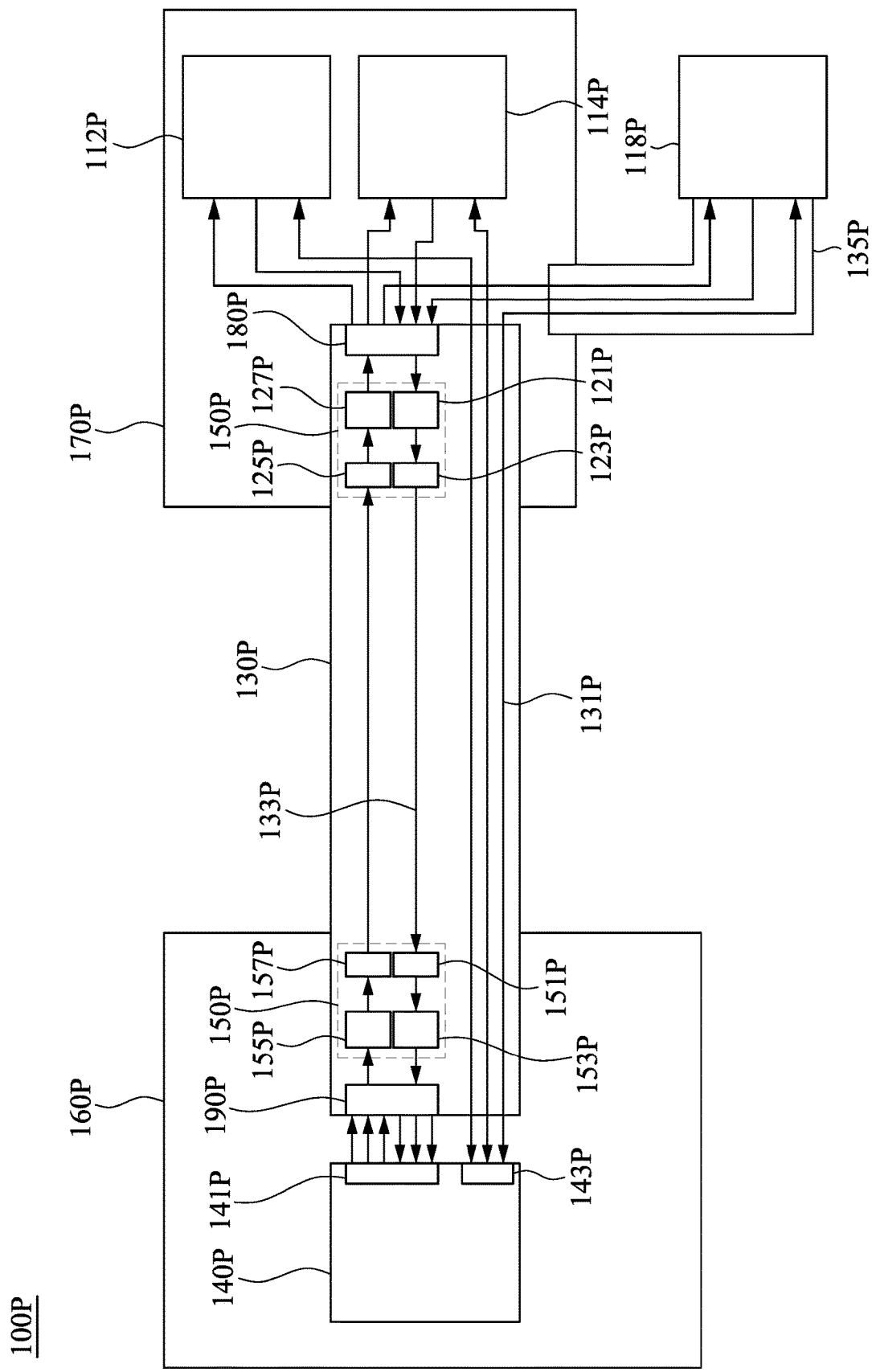
FIG. 23 depicts a schematic diagram of an image transmission system according to one embodiment of the present disclosure.

FIG. 23 depicts a schematic diagram of an image transmission system 100P according to one embodiment of the present disclosure. Compared with the image transmission system 100K shown in FIG. 17, the image transmission system 100P shown in FIG. 23 further includes an image capturing device 118P and a soft printed circuit 135P.

As shown in the figure, the image capturing device 118P is connected to the serializing/deserializing circuit 180P through the soft printed circuit 135P. It is noted that, the element in FIG. 23, whose symbol is similar to the symbol of the element in FIG. 17, has similar structure feature in connection with the element in FIG. 17. Therefore, a detail description regarding the structure feature of the element in FIG. 23 is omitted herein for the sake of brevity. Furthermore, the present disclosure is not limited to the structure as shown in FIG. 23, and it is merely an example for illustrating one of the implements of the present disclosure.

Figure 24:
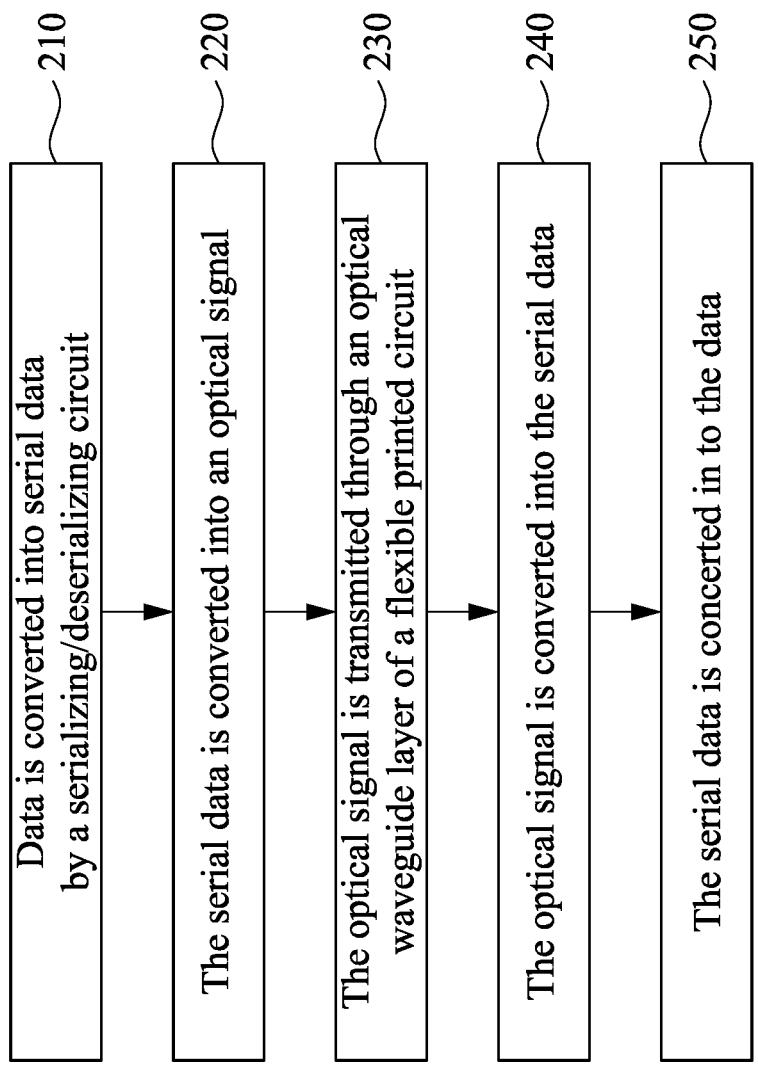
FIG. 24 depicts a flowchart of an image transmission method according to one embodiment of the present disclosure.

FIG. 24 depicts a flowchart of an image transmission method 200 according to one embodiment of the present disclosure. As shown in the figure, the image transmission method 200 includes the following steps. In step 210, data is converted into serial data by a serializing/deserializing circuit. In step 220, the serial data is converted into an optical signal. In step 230, the optical signal is transmitted through an optical waveguide layer of a flexible printed circuit. In step 240, the optical signal is converted into the serial data. In step 250, the serial data is concerted in to the data.

For facilitating the understanding of the image transmission method 200 shown in FIG. 24, reference is now made to FIG. 13. In step 210, the image capturing devices 112I, 114I, 116I capture data (e.g., parallel data), and transmit parallel data to the serializing/deserializing circuit 180I. The serializing/deserializing circuit 180I converts the parallel data into the serial data.

In step 220, the conversion device 120I converts the serial data into the optical signal 134I. In step 230, the conversion device 120I transmits the optical signal 134I to the optical waveguide layer 133I of the flexible printed circuit 130I, and the optical waveguide layer 133I transmits the optical signal 134I. In step 240, the conversion device 150I receives the optical signal, converts it into the serial data, and transmits the serial data to the serializing/deserializing circuit 190I. In step 250, the serializing/deserializing circuit 190I converts the serial data into data (e.g., parallel data), such that the image processor 140I may perform an image data processing to the data. However, the image transmission method 200 of the present disclosure is not limited to the above-mentioned embodiments, and it is merely an example for illustrating one of the implements of the present disclosure.

It can be understood from the embodiments of the present disclosure that application of the present disclosure has the following advantages. The image transmission system and the image transmission method of the present disclosure adopt a flexible printed circuit to transmit signals with high speed. In addition, the image transmission system of the present disclosure adopts serializing/deserializing circuit. Therefore, the numbers of pins of the image transmission system of the present disclosure can be reduced efficiently, so as to decrease numbers of transmission lines and interference, such that an excellent solution for image transmission with high speed is provided.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An image transmission system, comprising:
   at least one image sensor, configured to capture at least one image data;
   at least one convertor, configured to perform a conversion between the at least one image data and an optical signal;
   at least one image processor, configured to obtain the at least one image data according to the optical signal, and process the at least one image data; and
   an integrated optoelectronics flexible printed circuit, configured to transmit the optical signal and at least one electrical signal, wherein the at least one image sensor and the at least one convertor are disposed on the integrated optoelectronics flexible printed circuit;
   wherein the at least one convertor comprises:
   a first convertor, connected between the at least one image sensor and the integrated optoelectronics flexible printed circuit, and configured to perform a conversion between the at least one image data and the optical signal, wherein at least one optical waveguide layer of the integrated optoelectronics flexible printed circuit transmits the optical signal; and
   a second convertor, connected between the integrated optoelectronics flexible printed circuit and the at least one image processor, and configured to perform a conversion between the optical signal and the at least one image data, wherein the at least one image processor is configured to process the at least one image data.

2. The image transmission system of claim 1, wherein the integrated optoelectronics flexible printed circuit comprises at least one conductive layer, the at least one conductive layer is configured to transmit the at least one electrical signal between the at least one image sensor and the at least one image processor.

3. The image transmission system of claim 1, wherein the at least one image sensor, the at least one convertor, and the at least one image processor are disposed on the integrated optoelectronics flexible printed circuit.

4. The image transmission system of claim 1, further comprising:
a substrate, connected to the integrated optoelectronics flexible printed circuit, and configured to dispose the at least one image processor.

5. The image transmission system of claim 4, wherein the at least one convertor comprises:
a first convertor, comprising:
a photoelectric converter;
an optical detector;
a driver, internally installed in the at least one image sensor; and
an amplifier, internally installed in the at least one image sensor; and
a second convertor, internally installed in the at least one image processor.

6. The image transmission system of claim 4, wherein the at least one convertor is internally installed in the at least one image sensor.

7. The image transmission system of claim 1, wherein the at least one convertor comprises:
a photoelectric converter, disposed on the integrated optoelectronics flexible printed circuit;
an optical detector, disposed on the integrated optoelectronics flexible printed circuit;
a driver; and
an amplifier.

8. The image transmission system of claim 7, further comprising:
a substrate, connected to the integrated optoelectronics flexible printed circuit, and configured to dispose the at least one image processor.

9. The image transmission system of claim 8, wherein the driver and the amplifier of the at least one convertor are internally installed in the at least one image sensor.

10. The image transmission system of claim 1, wherein the at least one image sensor comprise:
a first image sensor, connected to a first connection terminal of the integrated optoelectronics flexible printed circuit; and
a second image sensor, connected to a second connection terminal of the integrated optoelectronics flexible printed circuit;
wherein the at least one image processor is connected to a third connection terminal of the integrated optoelectronics flexible printed circuit.

11. The image transmission system of claim 1, wherein each of the at least one image sensor and the at least one image processor comprises a serializing/deserializing circuit.

12. An image transmission system, comprising:
a plurality of image sensors, configured to capture a plurality of image data;
at least one serializing/deserializing circuit, configured to perform a conversion to the plurality of image data, so as to generate a serial data;
at least one convertor, configured to perform a conversion between the serial data and an optical signal;
at least one image processor, configured to obtain the plurality of image data according to the optical signal, and process the plurality of image data; and
an integrated optoelectronics flexible printed circuit, configured to transmit the optical signal and at least one electrical signal;
wherein the at least one serializing/deserializing circuit comprises:
a first serializing/deserializing circuit, connected to at least one image sensor of the plurality of image sensors; and
a second serializing/deserializing circuit, connected to the at least one image processor;
wherein the at least one convertor comprises:
a first convertor, connected between the first serializing/deserializing circuit and the integrated optoelectronics flexible printed circuit, and configured to perform a conversion between the serial data and the optical signal; and
a second convertor, connected between the integrated optoelectronics flexible printed circuit and the second serializing/deserializing circuit, and configured to perform a conversion between the optical signal and the serial data.

13. The image transmission system of claim 12, wherein the integrated optoelectronics flexible printed circuit comprises at least one conductive layer, the at least one conductive layer is configured to transmit the at least one electrical signal between the plurality of image sensors and the at least one image processor.

14. The image transmission system of claim 12, wherein the plurality of image sensors, the at least one serializing/deserializing circuit, the at least one convertor, and the at least one image processor are disposed on the integrated optoelectronics flexible printed circuit.

15. The image transmission system of claim 12,
wherein the plurality of image sensors, the first serializing/deserializing circuit, the at least one convertor, and the second serializing/deserializing circuit are disposed on the integrated optoelectronics flexible printed circuit.

16. The image transmission system of claim 15, further comprising:
a substrate, connected to the integrated optoelectronics flexible printed circuit, and configured to dispose the at least one image processor.

17. The image transmission system of claim 12,
wherein the first serializing/deserializing circuit, the at least one convertor, and the second serializing/deserializing circuit are disposed on the integrated optoelectronics flexible printed circuit.

18. The image transmission system of claim 17, further comprising:
a first substrate, connected to the integrated optoelectronics flexible printed circuit, and configured to dispose the plurality of image sensors; and
a second substrate, connected to the integrated optoelectronics flexible printed circuit, and configured to dispose the at least one image processor.

19. The image transmission system of claim 12, wherein the at least one convertor is disposed on the integrated optoelectronics flexible printed circuit.

20. The image transmission system of claim 19, further comprising:
a first substrate, connected to the integrated optoelectronics flexible printed circuit, and configured to dispose the plurality of image sensors; and
a second substrate, connected to the integrated optoelectronics flexible printed circuit, and configured to dispose the at least one image processor;
wherein the at least one serializing/deserializing circuit is disposed on the first substrate or the second substrate.

21. The image transmission system of claim 12, wherein the at least one convertor comprises:

a photoelectric converter, disposed on the integrated optoelectronics flexible printed circuit;
an optical detector, disposed on the integrated optoelectronics flexible printed circuit;
a driver; and
an amplifier.

22. The image transmission system of claim 21, further comprising:
a first substrate, connected to the integrated optoelectronics flexible printed circuit, and configured to dispose at least one image sensor of the plurality of image sensors; and
a second substrate, connected to the integrated optoelectronics flexible printed circuit, and configured to dispose the at least one image processor;
wherein the driver, the amplifier, and the at least one serializing/deserializing circuit are disposed on the first substrate or the second substrate.

23. The image transmission system of claim 12, further comprising:
a first substrate, connected to the integrated optoelectronics flexible printed circuit, and configured to dispose at least one image sensor of the plurality of image sensors; and
a second substrate, connected to the integrated optoelectronics flexible printed circuit, and configured to dispose the at least one image processor;
wherein the at least one serializing/deserializing circuit is disposed on the first substrate or the second substrate, and the at least one convertor is disposed on the first substrate or the second substrate.

24. The image transmission system of claim 12, wherein the plurality of image sensors comprise:
a first image sensor, connected to the at least one serializing/deserializing circuit;
a second image sensor, connected to the at least one serializing/deserializing circuit;
wherein the image transmission system further comprises:
a soft printed circuit; and
a third image sensor, connected to the at least one serializing/deserializing circuit through the soft printed circuit.

25. An image transmission method applied in an image transmission system, wherein the image transmission system comprises at least one image sensor, at least one convertor, at least one image processor, and integrated optoelectronics flexible printed circuit, wherein the at least one convertor comprises a first convertor and a second convertor, wherein the first convertor is connected between the at least one image sensor and the integrated optoelectronics flexible printed circuit, wherein the second convertor is connected between the integrated optoelectronics flexible printed circuit and the at least one image processor, comprising:
capturing, using the at least one image sensor, an image data;
converting, using a serializing/deserializing circuit, the image data into a serial data;
converting, using the at least one convertor, the serial data into an optical signal; and
transmitting the optical signal through at least one optical waveguide layer of the integrated optoelectronics flexible printed circuit.

* * * * *